(12) United States Patent
Todorov

(10) Patent No.: US 8,220,354 B2
(45) Date of Patent: Jul. 17, 2012

(54) BELT-DRIVEN ROBOT HAVING EXTENDED Z-AXIS MOTION

(75) Inventor: Alexander Todorov, Santa Clara, CA (US)

(73) Assignee: Genmark Automation, Inc., Milpitas, CA (US)

( * ) Notice: Subject to any disclaimer, the term of this patent is extended or adjusted under 35 U.S.C. 154(b) by 1141 days.

(21) Appl. No.: 11/520,982

(22) Filed: Sep. 13, 2006

(65) Prior Publication Data
US 2008/0041183 A1 Feb. 21, 2008

Related U.S. Application Data

(63) Continuation-in-part of application No. 11/478,005, filed on Jun. 28, 2006.

(51) Int. Cl.
*B25J 17/00* (2006.01)
*B25J 17/02* (2006.01)
*B25J 18/00* (2006.01)
*B66C 23/00* (2006.01)

(52) U.S. Cl. ............... 74/490.05; 74/490.07; 74/490.01; 901/15; 901/21; 414/744.3

(58) Field of Classification Search .............. 74/490, 74/490.01, 490.02, 490.04, 490.05, 490.07; 901/15, 21; 414/744.1–744.6; 187/255, 187/266, 267, 214, 270
See application file for complete search history.

(56) References Cited

U.S. PATENT DOCUMENTS

| | | | |
|---|---|---|---|
| 1,925,036 A | 8/1933 | Gorton | |
| 3,575,301 A | 4/1971 | Panissidi | |
| 4,872,799 A * | 10/1989 | Fisher, Jr. | 414/180 |
| 4,946,337 A | 8/1990 | Tonai et al. | |
| 4,978,274 A * | 12/1990 | de Groot | 414/744.3 |
| 5,085,556 A * | 2/1992 | Ohtomi | 414/744.3 |
| 5,100,284 A | 3/1992 | Boisseau | |
| 5,178,512 A | 1/1993 | Skrobak | |
| 5,476,358 A | 12/1995 | Costa | |
| 5,789,890 A | 8/1998 | Genov et al. | |
| 5,904,466 A * | 5/1999 | Miller et al. | 414/796.7 |
| 6,006,865 A * | 12/1999 | Ammon | 187/266 |
| 6,037,733 A | 3/2000 | Genov et al. | |
| 6,121,743 A | 9/2000 | Genov et al. | |
| 6,190,114 B1 * | 2/2001 | Ogawa et al. | 414/744.5 |

(Continued)

OTHER PUBLICATIONS

International Search Report, Application No. PCT/US07/17728, dated Jul. 18, 2008.

(Continued)

*Primary Examiner* — Richard W Ridley
*Assistant Examiner* — Daniel Yabut
(74) *Attorney, Agent, or Firm* — Nixon Peabody LLP

(57) ABSTRACT

A robot has a robot arm, a support structure, and a movable platform. The platform includes a cantilevered member coupled to a guide of the support structure such that motion of the platform is directed along a first direction. The robot further includes first and second timing belts having portions that extend along the first direction and that are disposed on opposite sides of the cantilevered member, and first and second shafts movable with the movable platform. The shafts are coupled to the respective timing belts, to the robot arm such that rotation of the first shaft imparts angular motion to the robot arm and rotation of the second shaft imparts radial motion. The robot also includes a third timing belt to which the platform is coupled and by which it is moved. Motors are provided that impart movement to the timing belts.

2 Claims, 28 Drawing Sheets

U.S. PATENT DOCUMENTS

| | | | |
|---|---|---|---|
| 6,489,741 B1 | 12/2002 | Genov et al. | |
| 6,826,977 B2 | 12/2004 | Grover et al. | |
| 7,040,456 B2 * | 5/2006 | Ach et al. | 187/251 |
| 2002/0078778 A1 | 6/2002 | Grover et al. | |
| 2008/0121064 A1 | 5/2008 | Todorov | |

OTHER PUBLICATIONS

International Search Report, Application No. PCT/US07/14495, dated Jul. 22, 2008.

Office Action, dated Nov. 18, 2008 in U.S. Appl. No. 11/478,005.
Office Action, dated Jun. 18, 2009 in U.S. Appl. No. 11/478,005.
Office Action, dated Oct. 28, 2009 in U.S. Appl. No. 11/478,005.
Office Action, dated Apr. 6, 2010 in U.S. Appl. No. 11/478,005.
Office Action in U.S. Appl. No. 11/478,005, mailed May 24, 2011.
Office Action in U.S. Appl. No. 11/478,005, mailed Oct. 5, 2010.
Office Action in U.S. Appl. No. 11/478,005, mailed Sep. 9, 2008.

* cited by examiner

BELT-DRIVEN ROBOT HAVING EXTENDED Z-AXIS MOTION

CROSS-REFERENCE TO RELATED APPLICATIONS

This application is a continuation-in-part of U.S. patent application Ser. No. 11/478,005, entitled "Robot with Belt-Drive System," filed on Jun. 28, 2006.

BACKGROUND OF THE INVENTION

1. Field of the Invention

The invention relates to robots used for substrate transport in semiconductor processing.

2. Description of the Related Art

Robots are commonly used in semiconductor processing environments, in order to transport substrates such as wafers to and from storage locations or various processing stations. The highly repetitive nature of the motions involved and the speeds required for high throughput make robots ideal candidates for these tasks. The types of motions of which these types of robots are capable vary. Typically, a robot 451 shown in FIG. 13, which has a robot body 453 and a robot arm 455 extending from the robot body will exhibit angular (θ), radial (R) and Z motions in a cylindrical coordinate system. As seen in FIG. 13, angular motion refers to rotation of the robot arm 455 about a primary axis 457 at which it is pivotably coupled to the robot body 453. Radial motion is extension/retraction motion of the robot arm 455 to and from the primary axis. Z motion is elevation of the robot arm 455 with respect to the robot body 453. Z motion is achieved by extending or retracting shaft 459 to which arm 455 is mounted out of or into robot body 453. Details of operation of such robots are described in U.S. Pat. No. 5,789,890, entitled "ROBOT HAVING MULTIPLE DEGREES OF FREEDOM" (Genov et al.).

Issues that are of concern in these types of robots include weight, size, complexity, and range. The present invention seeks to address one or more of these issues, to thereby improve factors such as robot performance, reliability, and throughput, and to increase longevity and reduce costs of robot manufacture and maintenance.

With respect to the issue of range, it will be appreciated that industry standards require that in an operating environment, 300 mm wafers storage cassettes, from which the robot 451 must retrieve the 300 mm wafers, must be disposed at a height of 900 mm. This imposes limitations on the robot height, which translate to limitations on robot range in the Z direction. When longer Z travel is required, one of two approaches has conventionally been implemented. The first approach, shown in FIG. 14, is to mount the robot 451 on an additional vertical translation module 461. This retains the ability of the robot to be dimensioned so as to reach the 900 mm high cassettes and to have the usual Z motion range provided by shaft 459 (FIG. 13), and would further augment that range by the additional travel permitted by vertical translation module 461. However, the translation module 461 is very heavy and cumbersome, and introduces significant amounts of inertia to the system. One reason for this is that typically such a module relies on a ball screw 475, which itself is heavy difficult to manipulate. The use of the translation module 461 therefore detracts from system speed, longevity, and overall performance while raising its cost and complexity. The second approach, shown in FIG. 15, is to provide a robot having telescoping ability. Robot 463 is shown having a plurality of vertically stacked, movable platforms 465, 467, 469, on which robot arm 471 is mounted. The platforms are supported on movable supports 473 that, in the retracted position, occupy a minimal amount of space in the Z dimension. Nonetheless, such an arrangement remains fairly constrained in its range, and requires expansion in the radial direction (R) to accommodate the additional collapsible supports 473, and is therefore cumbersome and tremendously complex.

BRIEF SUMMARY OF THE INVENTION

In accordance with an embodiment of the invention, there is provided a robot having a robot arm, a robot arm including a guide, and a platform mounted for motion relative to the support structure. The platform includes a cantilevered member coupled to the guide of the support structure such that motion of the platform is directed by the guide along a first direction. The robot further includes first and second primary timing belts having portions that extend substantially along the first direction and that are disposed on opposite sides of the cantilevered member, and first and second shafts supported by the movable platform for motion therewith in the first direction. The first and second shafts have a common shaft axis, extending in the first direction, about which the first and second shafts are independently rotatable. The first and second shafts are coupled to the first and second primary timing belts, respectively, and are further coupled to the robot arm such that rotation of the first shaft imparts angular motion to the robot arm and rotation of the second shaft imparts radial motion to the robot arm. The robot also includes a third timing belt having a portion configured to extend in the first direction, with platform being coupled to this portion such that movement of this portion along the first direction imparts movement to the platform in the first direction. First, second and third motors configured such that actuation of the first, second and third motors imparts motion to the first, second and third timing belts, respectively, are also provided.

BRIEF DESCRIPTION OF THE SEVERAL VIEWS OF THE DRAWINGS

Many advantages of the present invention will be apparent to those skilled in the art with a reading of this specification in conjunction with the attached drawings, wherein like reference numerals are applied to like elements, and wherein.

DETAILED DESCRIPTION OF THE INVENTION

Embodiments of the present invention are described herein in the context of robots used for substrate transport in semiconductor processing. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
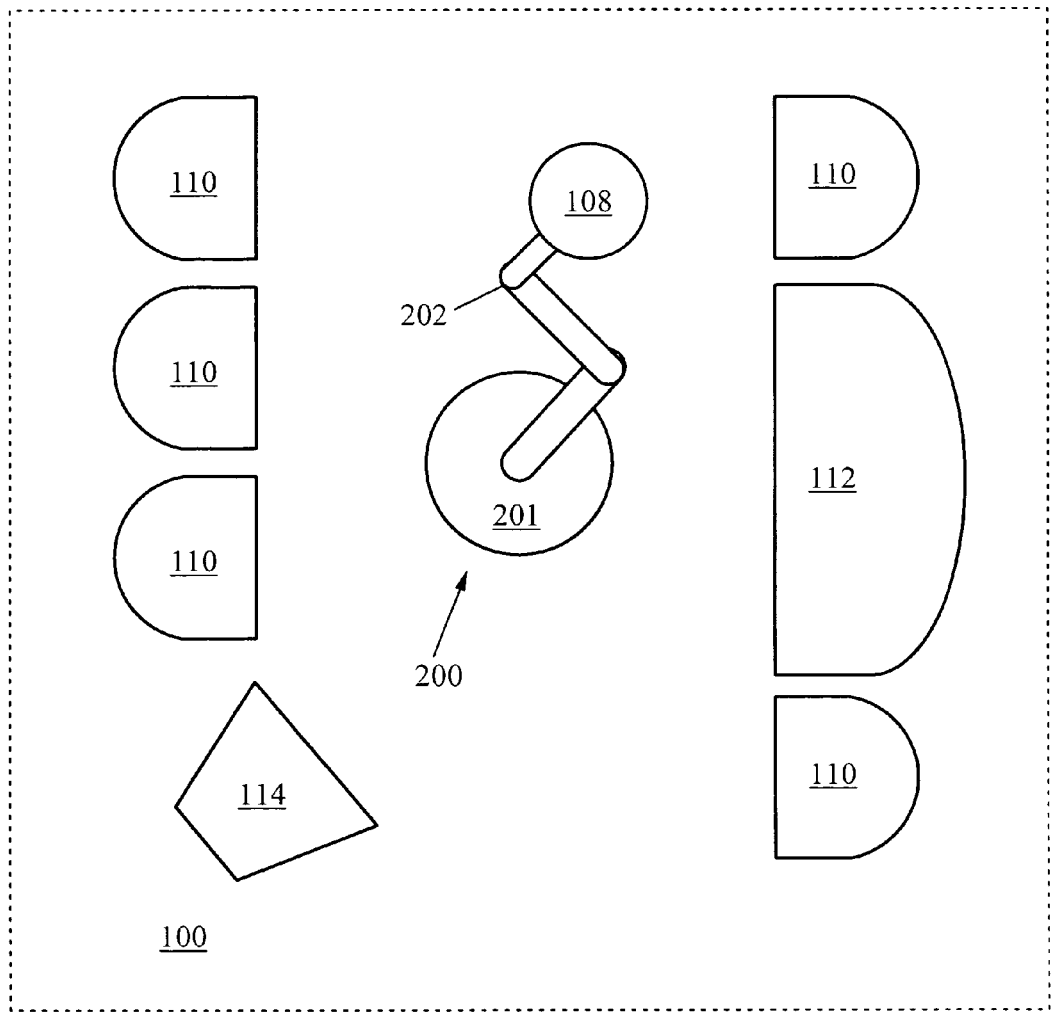
FIG. 1 is a top plan view of a semiconductor processing environment including a robot.

FIG. 1 is a top plan view of a semiconductor processing environment 100, typically exhibiting clean room conditions. A robot 200 having a robot body 201 and a robot arm 202 is disposed between two rows of stations 106. The robot arm 202 is configured to carry a semiconductor wafer 108, for example a standard 300 mm wafer, between the stations 106. Other substrates may also be similarly transported, for example 200 mm wafers, flat panel displays, and so forth. The stations 106 include for example one or more storage cassettes 110 in which the substrates—that is, the 300 mm wafers in this example—are stacked. Additional stations, such as CVD (chemical vapor deposition) stations 112, may be provided, in which various fabrication procedures take place. Also included is a prealignment station 114 at which the wafer 108 may be deposited such that its orientation can be determined and/or adjusted. Alignment may also be conducted by the robot arm itself if suitably equipped.

Figure 2:
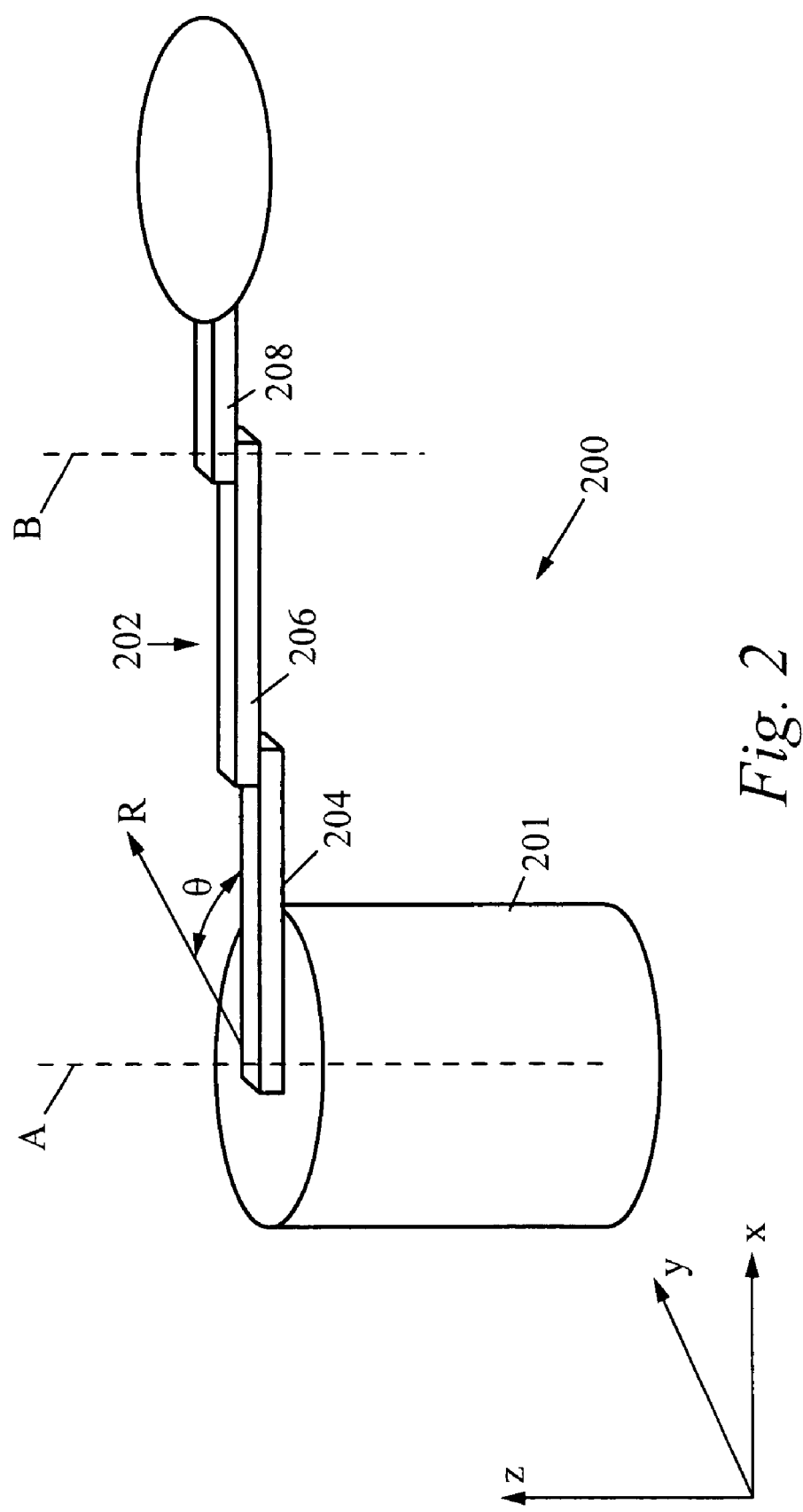
FIG. 2 is a schematic view of the robot of FIG. 1.

FIG. 2 is a more detailed view of robot 200 of FIG. 1. Arm 202 comprises a plurality of links 204, 206 and 208, the distalmost of which, 208, engages the substrate to be transported and is herein referred to as the end effector. Robot 200 exhibits R, θ and Z motion as defined in a polar coordinate system, with the R motion being generally radial motion of the distalmost link (that is, end effector 208) from primary axis A of the robot 200. θ motion is rotation of arm 202 about the primary axis A. Z motion is motion of arm 202 along primary axis A (that is, "up-down" motion). In addition, end effector 208 may exhibit yaw (Y) motion, which is defined as rotation about an end effector or yaw axis B which is substantially parallel to primary axis A. While not detailed herein, additional motions, such roll and pitch of the end effector 208, and tilting of the robot 200 relative to the Z axis, are also contemplated.

Figure 3:
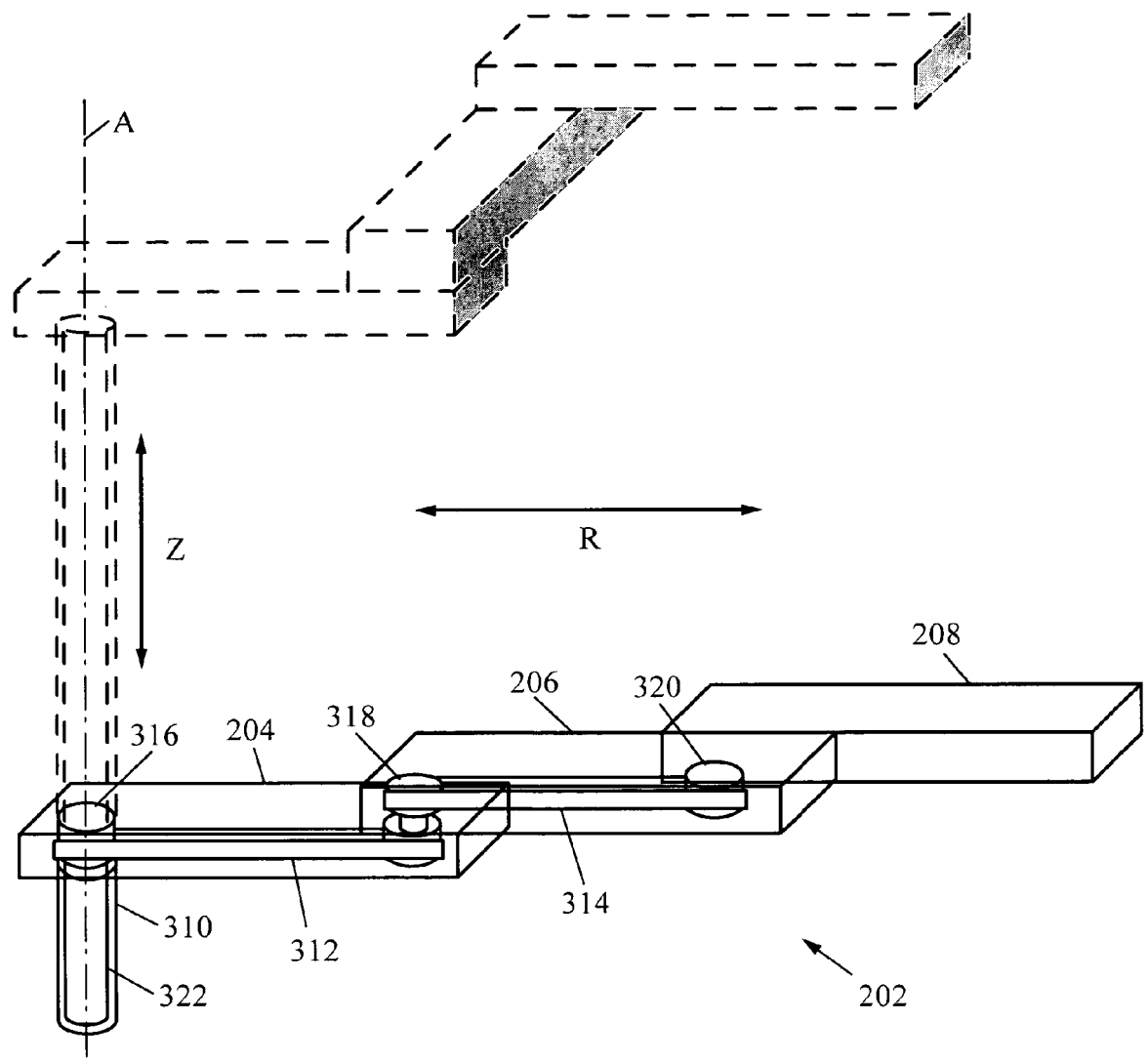
FIG. 3 is a schematic view detailing the motions of the robot arm of the robot of FIG. 2.
Figure 4:
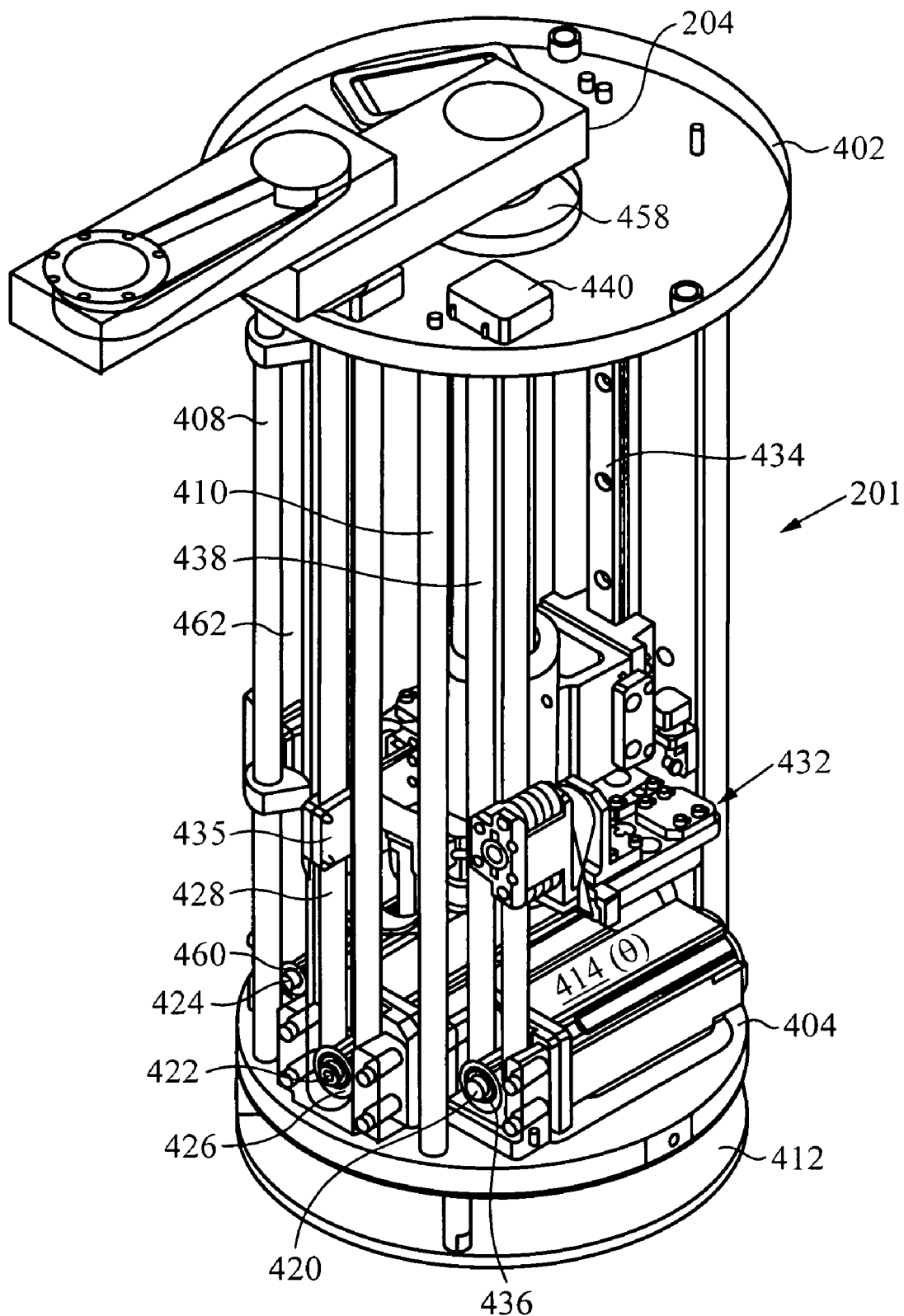
FIGS. 4-9B are perspective views showing details of the interior of the robot of FIG. 2.
Figure 5:
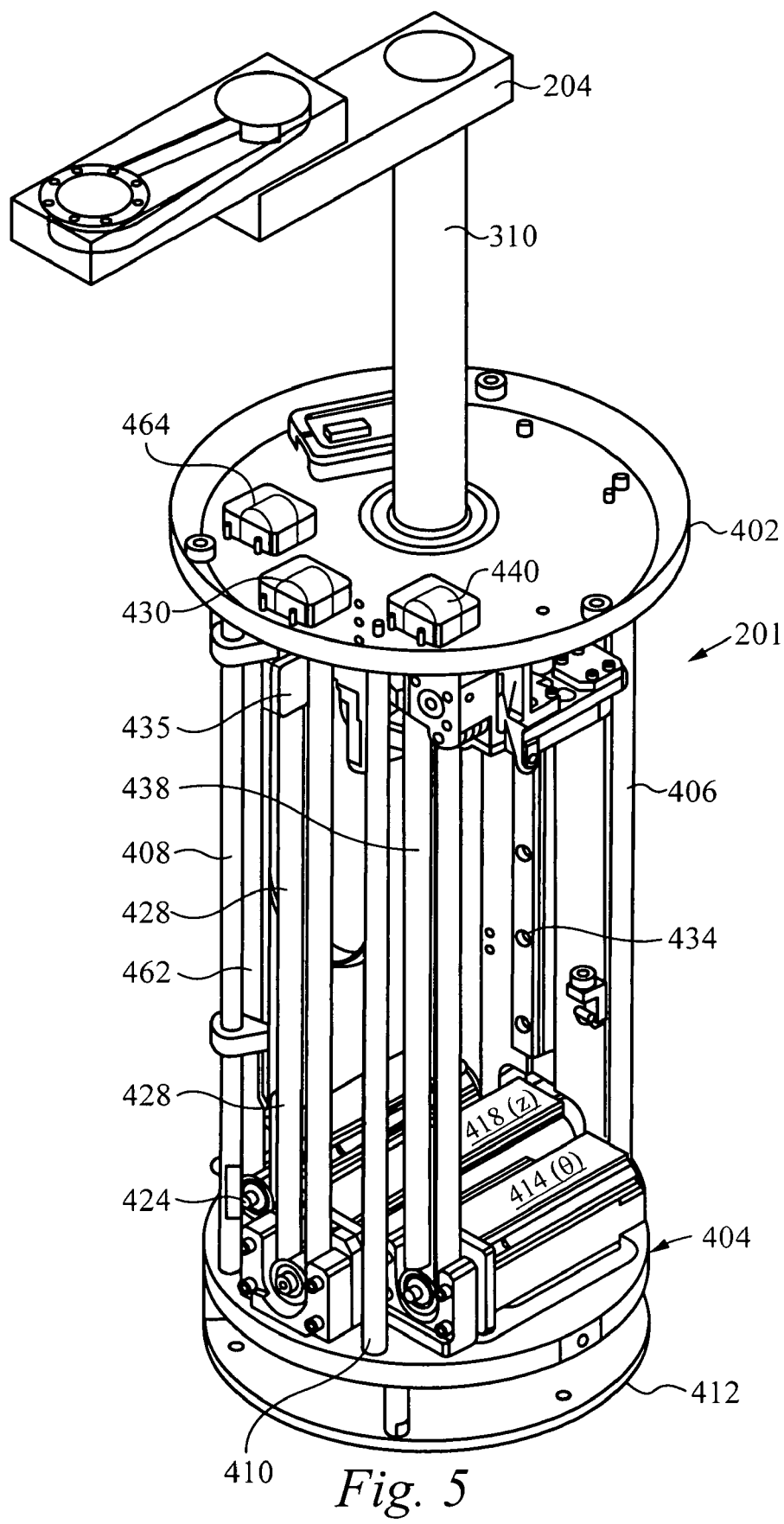
Figure 6:
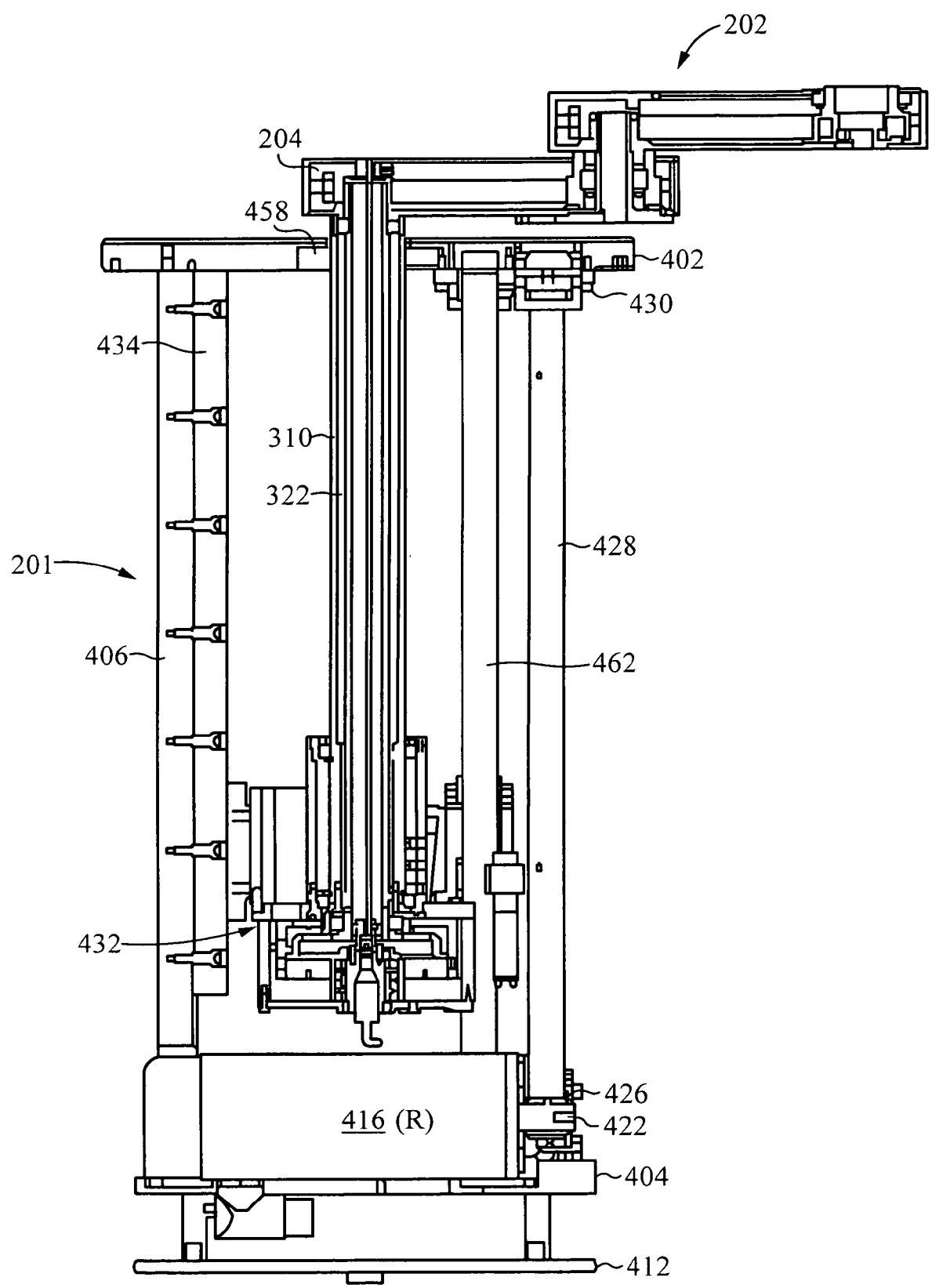
Figure 7:
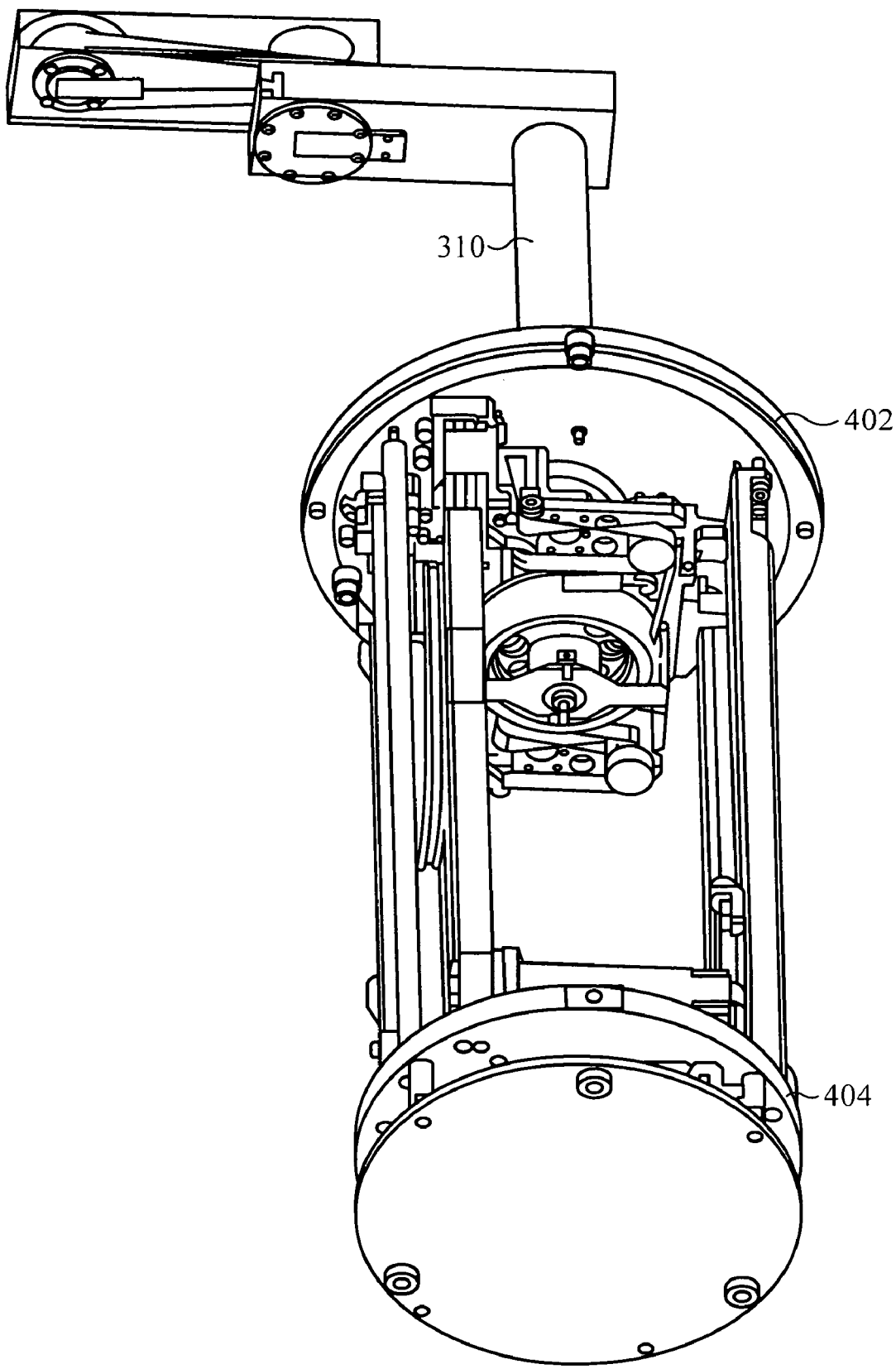
Figure 8:
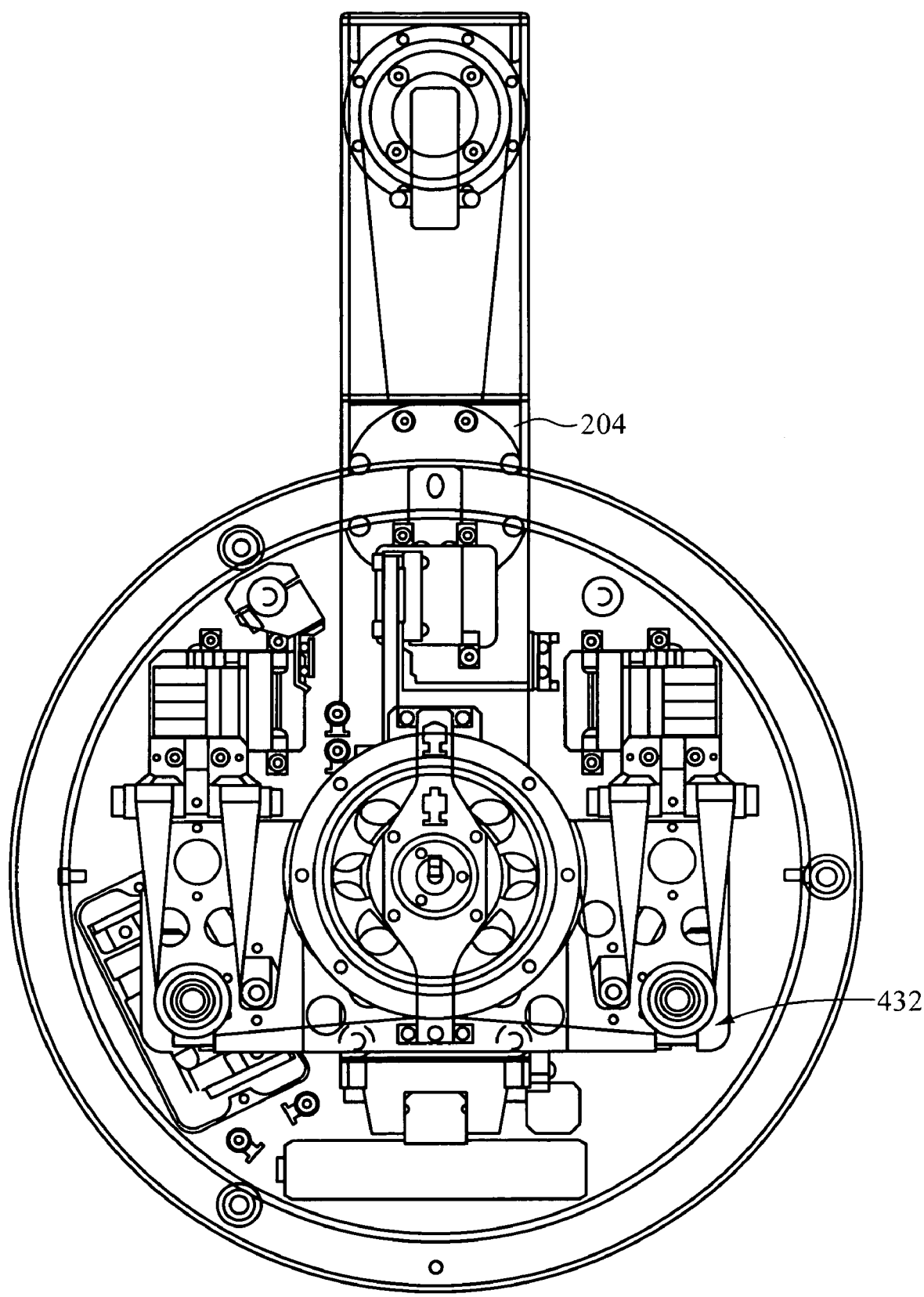

FIG. 3 is a schematic diagram illustrating details of the manner in which R and θ motions of robot arm 202 are effected. Links 204, 206 and 208 (end effector) are pivotably coupled to one another. Taking primary axis A as the point of reference, a first, outer driving shaft 310 is rigidly connected to the proximalmost portion of proximalmost link 204. Driving shaft 310 is centered about primary axis A and is mounted for rotation axially around said axis. Rotation of outer driving shaft 310 provides angular rotation—that is, the θ motion—of link 204 and robot arm 202. Rotation takes place bidirectionally—that is, clockwise and counter-clockwise—and is, "endless", meaning that it is not limited to a full circle but can take the form of multiple, or an "infinite" number of revolutions.

An arm radial (R) motion linkage is provided to effect radial (R) motion of the robot arm 202. The arm radial motion linkage includes a plurality of belts and pulleys coupled to the links 204-208. Motion of the plurality of belts and pulleys, including belts 312 and 314 and pulleys 316, 318 and 320, is motivated by inner driving shaft 322 and is coordinated such that rotation of the inner driving shaft causes retraction or extension of arm 202 in the radial (R) direction. Details of radial (R) motion implementation are provided in the aforementioned U.S. Pat. No. 5,789,890.

During maneuvering of the robot arm 202, the θ and R motions are synchronized in a controlled manner for optimum performance. Synchronization takes place by controlling the rotational motions of outer driving shaft 310 and inner driving shaft 322, which can be moved independently of one another. Control and synchronization of arm 202 are effected in the spatial, velocity and acceleration planes such that multi-segment smooth trajectories including non-radial straight line motion of the end effector 308 can be achieved. The term "non-radial" is with reference to primary axis A and means that the end effector 208 is movable in a straight line that does not pass through said primary axis. During this and other motions, the orientation of the end effector 208 can be preserved or controllably altered as desired. One manner of providing this feature is through the use of independent yaw (Y) motion of the end effector 208. It will be appreciated that the arrangement described herein is exemplary only and that other arrangements for effecting θ, R and Y motions are contemplated, including those that use different numbers of pulleys and belts, different gearing ratios, and so forth. It will also be appreciated that while the discussion herein is directed to robot arms having three links, the same principles are applicable to a greater or lesser number of links and the concepts described herein are equally applicable to such devices. Further details of the manner in which θ, R and Y motions are achieved and synchronized in a robot arm such as arm 202 can be found for example in the aforementioned U.S. Pat. No. 5,789,890, entitled "ROBOT HAVING MULTIPLE DEGREES OF FREEDOM (Genov et al.).

FIGS. 4-9B are various views showing inner details of robot body 201. A portion of arm 202 excluding end effector 208 is also shown, in a first elevation in FIG. 4 and in a higher elevation in FIG. 5. Inner (322) and outer (310) driving shafts are in their lowest position in FIG. 4. They are in a raised position in FIG. 5, such that robot arm 202 is at its lowest height or Z position in FIG. 4, and is at a higher elevation or Z position in FIG. 5.

As seen from the drawings, a frame structure is comprised of top plate 402 and base plate 404. These are mounted substantially parallel to one another and supported by a side plate 406 and a pair of vertical supports 408 and 410. Base plate 404 may be raised above a bottom flange 412, with sufficient clearance to accommodate circuit boards and/or other components (not shown) such as the robot controller if desired.

Disposed between top plate 402 and base plate 404 are three motors, 414, 416 and 418 dedicated respectively to the θ, R and Z motions exhibited by the robot 200. The motors are mounted horizontally—that is, each of their drive shafts lies substantially in a horizontal plane which is parallel to base plate 404 on which the motors are preferably mounted, and is disposed substantially perpendicularly to the primary axis A along which the inner (322) and outer (310) driving shafts translate. A robot body angular (θ) motion linkage, of which outer driving shaft 310 is part, transfers rotational motion of drive shaft 420 of motor 414 to proximalmost link 204 of robot arm 202 such that angular (θ) motion of the robot arm is achieved. A robot body radial (R) motion linkage, of which inner driving shaft 322 is part, transfers rotational motion of drive shaft 424 of motor 416 to the arm radial motion linkage such that radial (R) motion of robot arm 202 is achieved. A Z motion linkage transfers rotational motion of drive shaft 422 of motor 418 to axial motion of inner (322) and outer (310) driving shafts such that Z motion of arm 202 attached thereto is achieved.

The Z motion linkage includes a first drive pulley 426 coupled for rotation with drive shaft 422 of motor 418. Either direct drive or a geared drive of pulley 426 by drive shaft 422 is contemplated. Drive pulley 426 is geared, or toothed, and engages with and rotates timing belt 428 which extends between drive pulley 426 and driven idler pulley (also toothed or geared) 430 mounted to the bottom-facing portion of top plate 402. Timing belt 428 is thus stationarily mounted in robot body 201, meaning that even though it rotates, its position in the robot body does not change. Timing belt 428 is provided with teeth on the interior face thereof, said teeth engaging the teeth of drive pulley 426 and the teeth of driven idler pulley 430 to minimize relative slippage between the timing belt and the pulleys. As an alternative to a belt, which is preferably made of Kevlar™ or other minimal stretch material, a stainless steel band having suitable slots or holes for engaging appropriately-configured teeth on drive pulley 426 and idler pulley 430 can be used. Timing belt 428 is kept in tension to minimize slack. To provide adjustment of this tension, vertical adjustment of the position of drive pulley 426 and/or of idler pulley 430 can be provided, using a suitable adjustment mechanism, such as set screws (not shown) or the like. Moving one or both the drive pulley 426 and/or of idler pulley 430 pulleys apart increases the tension of belt 428, and moving them closer together reduces tension. In the preferred direct drive case, moving drive pulley 426 may entail moving the motor 418 and shaft 422 on which the drive pulley is mounted. This can be accomplished in a simple manner using set screws (not shown) or the like for instance.

A floating Z platform 432 supporting coaxial or nested driving shafts 310 and 322 is provided. Floating Z platform 432 is movable in the Z direction (vertical or up-down in this example) and is guided in said motion by a linear guide 434 provided on support plate 406. The guide 434 serves to substantially limit motion of floating Z platform 432 to a single direction—the Z direction. Motion of Z platform 432 is tied to that of timing belt 428. This is accomplished by providing a clamp 435 or similar connection mechanism which is rigidly attached to Z platform 432 and which is clamped to timing belt 428 such that it is immovable relative to the belt. It will be appreciated that clamp 435 should be clamped to a portion of timing belt 428 that exhibits Z (up-down) motion, but that the configuration of the timing belt can be different from that shown. In other words, timing belt 428 can have more than the two legs (428a, 428b) shown (FIG. 9A), and these legs do not all have to extend vertically or even be in the same plane, so long as at least a portion of one leg extends vertically, to which portion the clamp 435 should be coupled. When motor 418 is actuated, it rotates drive pulley 426, which moves timing belt 428, thereby vertically moving Z platform 432 clamped thereto. This causes shafts 310 and 322 to move in the Z direction, and, commensurately, arm 202 coupled to the upper portions of the shafts. Because the motors 414, 416 and 418 are disposed at the bottom of the interior region of robot body 201 and are preferably side by side and arranged such that they are parallel to and close to the base plate 404, they provide clearance for Z platform 432, allowing its descent unimpeded towards the bottom of the robot body 201. This allows for a vertically more compact robot body and/or more Z travel for robot arm 202.

Figure 10:
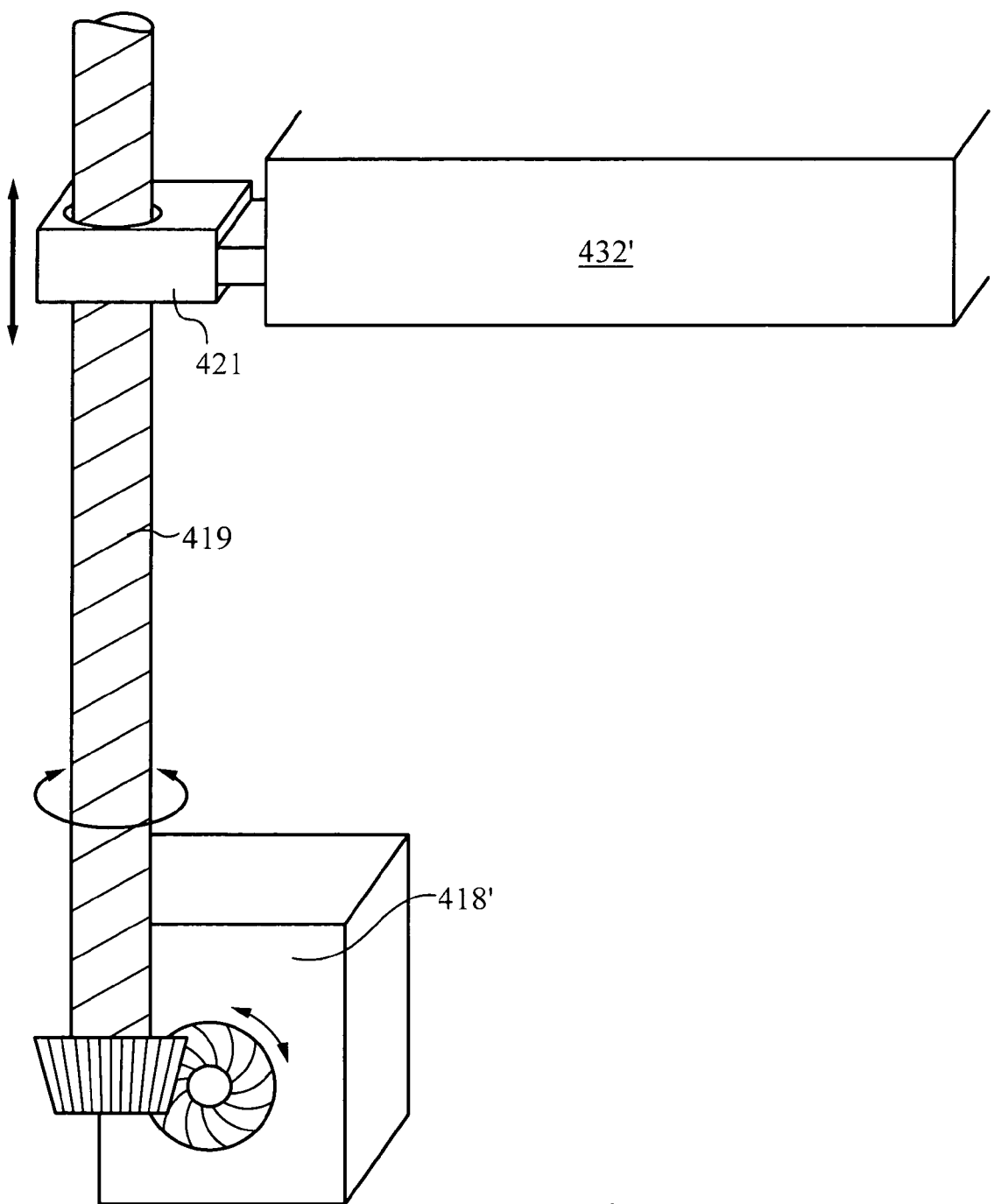
FIG. 10 is a schematic view of an alternative Z motion linkage using a threaded rod and engaged threaded nut.
Figure 11:
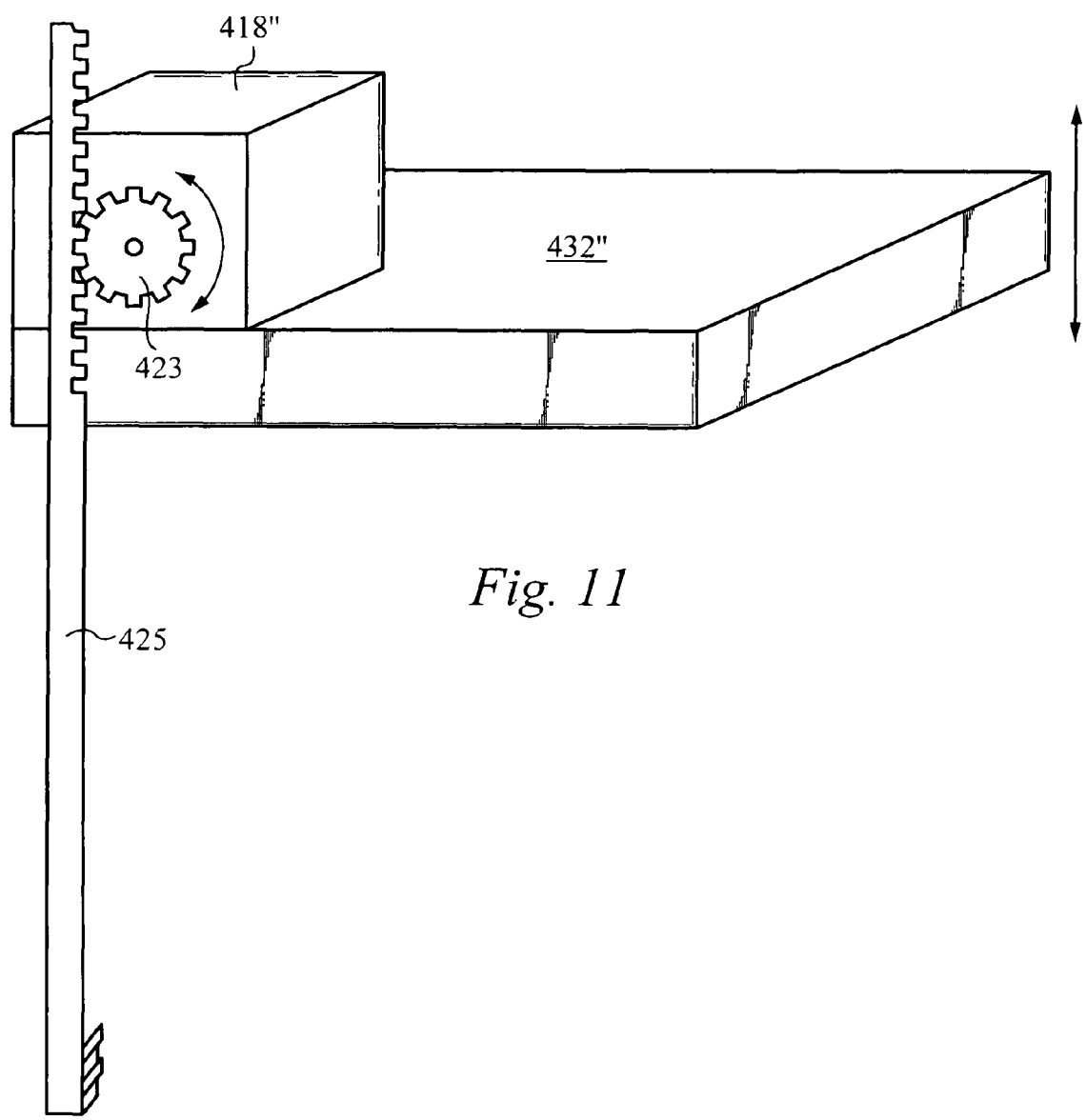
FIG. 11 is a schematic view of an alternative Z motion linkage using a rack and pinion arrangement.

It will be appreciated that in other embodiments the Z motion linkage can be a means for motivating the Z platform in the Z direction other than timing belt 432 and clamp 435. Instead, a screw-type mechanism can be used, as shown in FIG. 10, in which a motor 418' rotates a vertically mounted threaded rod 419 which engages threaded nut 421 rigidly mounted to the floating Z platform 432'. Alternatively, a rack-and-pinion arrangement as shown in FIG. 11 can be used, wherein a motor 418" mounted in floating Z platform 432" rotates a pinion 423 which engages a toothed rack 425, imparting Z motion to the floating Z platform on which the motor and pinion are mounted.

The robot body angular (θ) motion linkage includes a first drive pulley 436 coupled for rotation with drive shaft 420 of motor 414. Again, either direct drive or a geared drive is contemplated. Drive pulley 436 is geared, or toothed, and serves to rotate a primary timing belt 438 which extends between drive pulley 436 and driven idler pulley (also toothed or geared) 440 mounted to the bottom-facing portion of top plate 402. Primary timing belt 438 is thus stationarily mounted in robot body 201, meaning that even though it rotates, its position in the robot body does not change. Primary timing belt 438 is provided with teeth on the interior face thereof, these teeth engaging the teeth of drive pulley 436 and driven idler pulley 440 to minimize relative slippage of the timing belt and pulleys. As an alternative to a belt, which is preferably made of Kevlar™ or other minimal-stretch material, a stainless steel band having suitable slots or holes for engaging appropriately-configured teeth on drive pulley 436 and idler pulley 440 can be used. Primary timing belt 438 is kept in tension to minimize slack. To provide adjustment of this tension, the position of drive pulley 436 and/or of idler pulley 440 can be adjusted vertically. Moving one or both of these pulleys apart increases the tension of belt 438, and moving them towards one another reduces the tension. Of course, in the preferred direct drive case, moving drive pulley 436 entails moving the motor 414 and shaft 420 on which the drive pulley is mounted. This can be accomplished in a simple manner using set screws (not shown) for instance.

An angular (θ) motion conversion assembly is mounted to floating Z platform 432 and coupled to primary timing belt 438. The angular (θ) motion conversion assembly includes a driving (442) and a driven (444) pulley (FIG. 9A) that are axially coupled to one another such that rotation of driving pulley 442 causes rotation of driven pulley 444. The pulleys 442 and 444 are toothed, with the teeth of driving pulley 442 engaging the teeth of primary timing belt 438. Guiding wheels 446 and 448 provided on either side of driving pulley 442 serve to bias the driving pulley against primary timing belt 438 for proper engagement therewith. The teeth of driven pulley 444 engage the teeth of a secondary timing belt 450 which is coupled to outer driving shaft 310 by way of a large, toothed pulley 452 mounted axially to the base of the driving shaft (FIG. 9C). As an alternative to a belt, which is preferably made of Kevlar™ or other minimal stretch material, a stainless steel band having suitable slots or holes for engaging appropriately-configured teeth on driven pulley 444 and large pulley 452 can be used. Secondary timing belt 450 has a 90-degree "folded" configuration such that rotation of pulleys 442 and 444 in a first (horizontal) axis is converted to rotation of outer driving shaft 310 in a second (vertical) axis substantially orthogonal to the first. Folding is effected using an arrangement of freely rotating pins or wheels 454, optionally in combination with toothed pulleys 456, around which the secondary timing belt 450 is directed to achieve the desired tension and directional changes. Large pulley 452 is rotationally mounted in floating Z platform 432 and is rigidly connected to the base of outer driving shaft 310 such that its rotational motion caused by secondary timing belt 450 causes rotation of outer driving shaft 310 (see FIG. 9C). Shaft 310 (and shaft 322) passes through top plate 402 and is free to rotate and slide axially therein. A bearing 458 in top plate 402 facilitates this. Axial motion of outer shaft 310 is coupled to axial motion of inner shaft 322 disposed therein such that the two shafts move axially (Z motion) together along the robot primary axis. However, rotational motion of the two shafts is independent—that is, the two shafts may simultaneously or alternately rotate in the same direction at the same or different rates, or they may rotate in opposite directions at the same or different rates. Suitable bearings (not shown) are provided to ensure this. The two shafts 310 and 322 are therefore rotationally independent of one another.

It will be appreciated that driving pulley 442 of the angular (θ) motion conversion assembly should couple to a portion of primary timing belt 438 that extends in the Z (up-down) direction commensurately with the travel of the floating Z platform 432 to which the angular (θ) motion conversion assembly is mounted, but the configuration of the primary timing belt can be different from that shown. In other words, the primary timing belt 438 can have more than the two legs (438a, 438b) shown (FIG. 9A), and these legs do not all have to extend vertically or even be in the same plane, so long as at least a portion of one leg extends vertically to the same extent as the desired travel of the floating Z platform 432.

The robot body radial (R) motion linkage includes a first drive pulley 460 coupled for rotation with drive shaft 424 of motor 416. Again, either direct drive or a geared drive is contemplated. Drive pulley 460 is geared, or toothed, and serves to rotate a primary timing belt 462 which extends between drive pulley 460 and driven idler pulley (also toothed or geared) 464 mounted to the bottom-facing portion of top plate 402. Primary timing belt 462 is thus stationarily mounted in robot body 201, meaning that even though it rotates, its position in the robot body does not change. Primary timing belt 462 is provided with teeth on the interior face thereof, these teeth engaging the teeth of drive pulley 460 and driven idler pulley 464 to minimize relative slippage of the timing belt and pulleys. As an alternative to a belt, which is preferably made of Kevlar™ or other minimal-stretch material, a stainless steel band having suitable slots or holes for engaging appropriately-configured teeth on drive pulley 460 and idler pulley 464 can be used. Primary timing belt 462 is kept in tension to minimize slack. To provide adjustment of this tension, the position of drive pulley 460 and/or of idler pulley 464 can be adjusted vertically. Moving one or both of these pulleys apart increases the tension of belt 462, and moving them towards one another reduces the tension. Of course, in the preferred direct drive case, moving drive pulley 460 entails moving the motor 416 and shaft 424 on which the drive pulley is mounted. This can be accomplished in a simple manner using set screws (not shown) for instance.

Figure 9A:
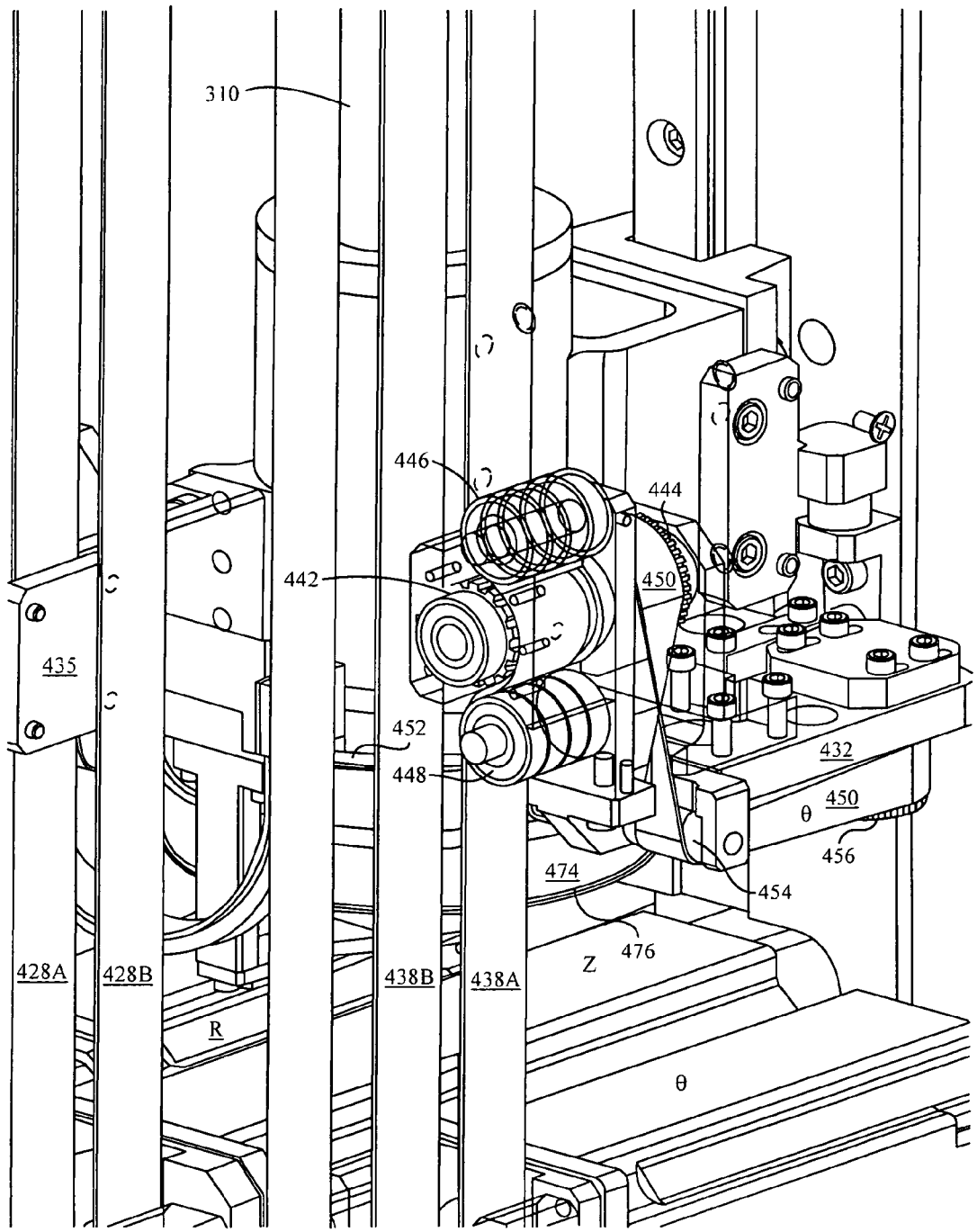
FIG. 9C is a schematic view showing the connection of the coaxial shafts to the respective large pulleys driven by the secondary timing belts.
Figure 9B:
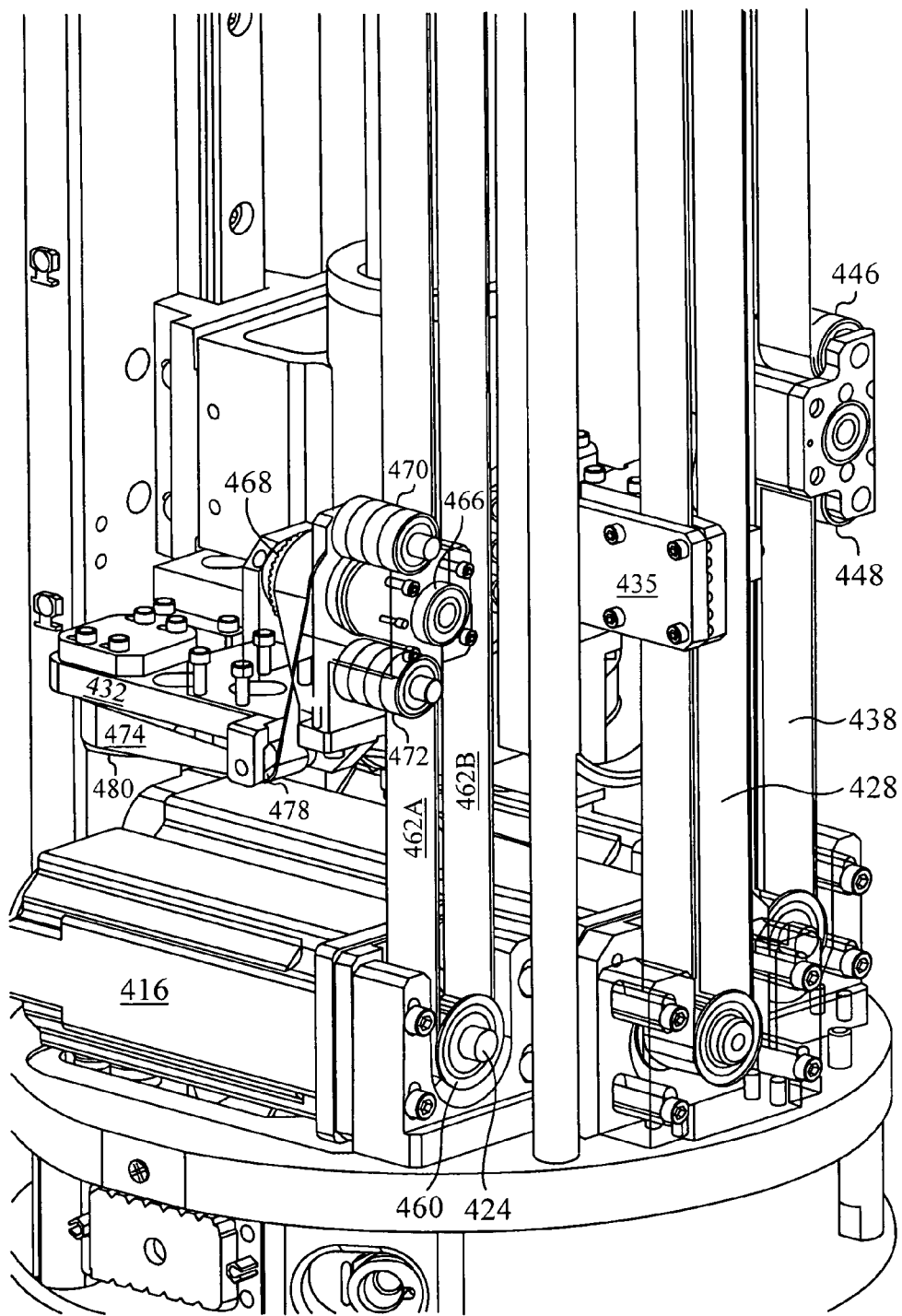
Figure 9C:
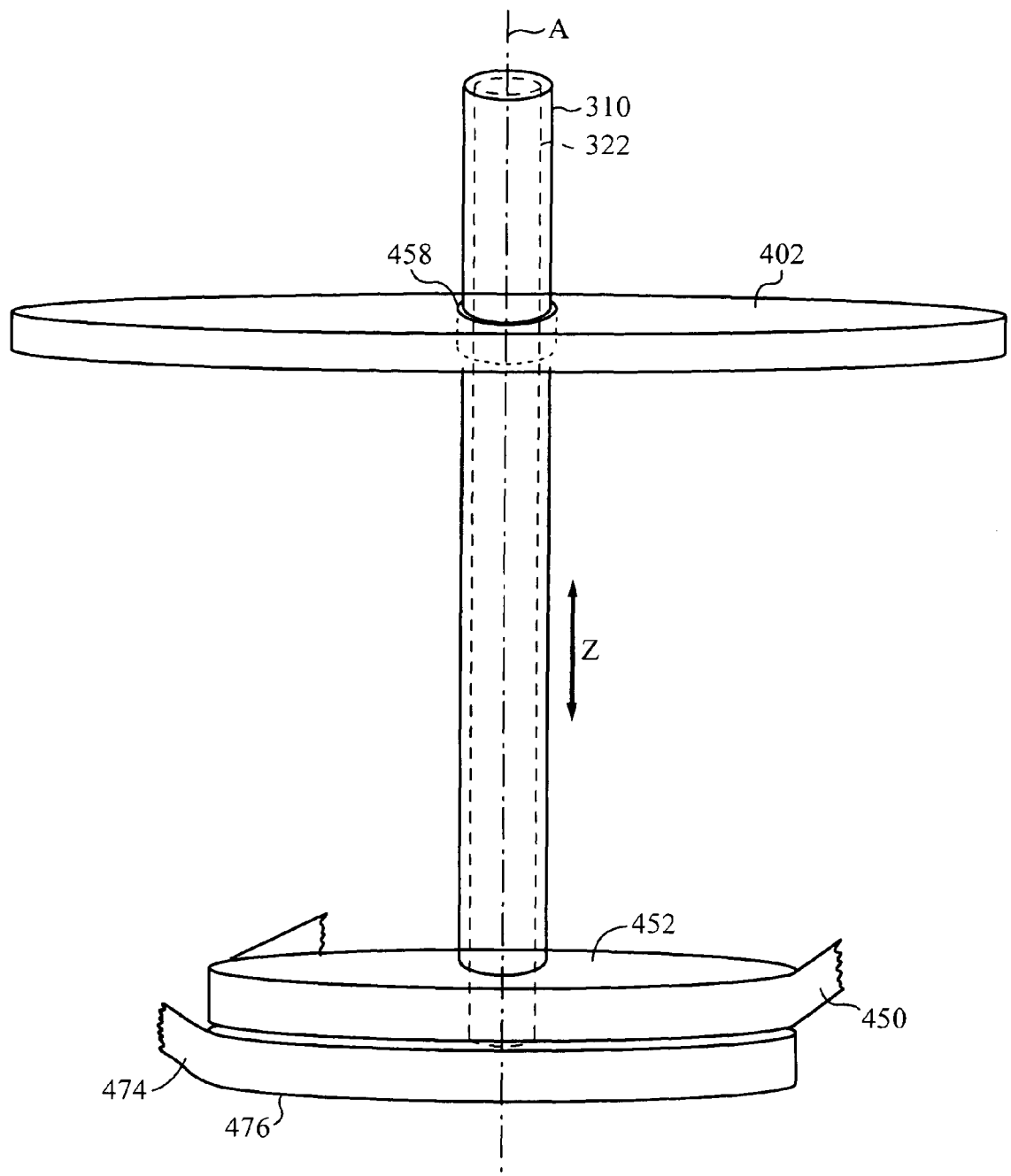

A radial (R) motion conversion assembly is mounted to floating Z platform 432 and coupled to primary timing belt 462, as detailed in FIG. 9B. The radial (R) motion conversion assembly includes a driving (466) and a driven (468) pulley that are axially coupled to one another such that rotation of driving pulley 466 causes rotation of driven pulley 468. The pulleys 466 and 468 are toothed, with the teeth of driving pulley 466 engaging the teeth of primary timing belt 462. Guiding wheels 470 and 472 provided on either side of driving pulley 466 serve to bias the driving pulley against primary timing belt 462 for proper engagement therewith. The teeth of driven pulley 468 engage the teeth of a secondary timing belt 474 which is coupled to inner driving shaft 322 by way of a large, toothed pulley 476 attached axially to the base of the driving shaft (FIG. 9C). As an alternative to a belt, which is preferably made of Kevlar™ or other minimal stretch material, a stainless steel band having suitable slots or holes for engaging appropriately-configured teeth on driven pulley 468 and large pulley 476 can be used. Secondary timing belt 474 has a 90-degree "folded" configuration such that rotation of pulleys 466 and 468 in a first (horizontal) axis is converted to rotation of inner driving shaft 322 in a second (vertical) axis. Folding is effected using an arrangement of freely rotating pins or wheels 478, optionally in combination with toothed pulleys 480, around which the secondary timing belt 474 is directed to achieve the desired tension and directional changes. Large pulley 476 is rotationally mounted in floating Z platform 432 below and coaxially with large toothed pulley 452 and is rigidly connected to the base of inner driving shaft 322 such that its rotational motion caused by secondary timing belt 474 is transferred to rotation of the inner shaft. Inner shaft 322 is nested in outer shaft 310, both of which pass through top plate 402 and are free to rotate and slide axially (up-down) therein. A bearing 458 in top plate 402 between the plate and outer driving shaft 310 facilitates this, optionally along with a bearing between the shafts (not shown) to facilitate their rotation independently of one another. As stated above, independent rotational motion of the shafts means that the two shafts may simultaneously or alternately rotate in the same direction at the same or different rates, or they may rotate in opposite directions at the same or different rates. It will be appreciated that driving pulley 466 of the radial (R) motion conversion assembly should couple to a portion (462a, 462b) (FIG. 9B) of primary timing belt 462 that extends in the Z direction commensurately with the travel of the floating Z platform 432 to which the radial (R) motion conversion assembly is mounted, but that the configuration of the primary timing belt 462 can be different from that shown. In other words, the primary timing belt 462 can have more than the two legs 462a, 462b shown, and these legs do not all have to extend vertically or even be in the same plane, so long as at least a portion of one leg extends vertically to the same extent as the desired travel of the floating Z platform 432.

The arrangement detailed above provides the robot 200 with motion along three axes—R, θ and Z. That is, robot 200 is thus provided with three degrees of freedom. Moreover, angular (θ) motion is unrestricted, meaning that an "endless" number of revolutions of robot arm 202 is possible, with no cables or other mechanical encumbrances preventing rotations of greater than 360 degrees. In addition, other degrees of freedom, including yaw (Y), pitch and roll of the end effector 208 are possible, in accordance with principles described in the aforementioned U.S. Pat. No. 5,789,890, entitled "ROBOT HAVING MULTIPLE DEGREES OF FREEDOM (Genov et al.).

It will be appreciated that because of the manner in which the robot body angular (θ) motion linkage and the robot body radial (R) motion linkage are coupled to the Z motion linkage, Z motion must be synchronized with angular (θ) and radial (R) motions to achieve independence of all three of these motions. For instance, consider the case in which only Z motion is desired, and the angular (θ) and radial (R) positions of the robot arm 202 are to remain unchanged—that is, no angular (θ) or radial (R) motions are to occur. As floating Z platform 432 is raised or lowered by action of motor 418 and timing belt 428, relative motion between primary timing belt 438 and driving pulley 442 of the angular (θ) motion conversion assembly should be avoided, and, in addition, relative motion between primary timing belt 462 and driving pulley 466 of the radial (R) motion conversion assembly should be avoided, because such relative motions would cause undesired angular (θ) and/or radial (R) displacement of robot arm 202. There are several ways to prevent this relative motion. The preferred manner is by actuating the motors 414 and 416 commensurately with the Z motion. Another approach is to decouple the θ and R motion conversion assemblies from their associated motors 414 and 416, for instance by placing the motors in a "neutral" position, and/or by disengaging the pulleys 442 and 466 from the primary timing belts 438 and 462, and so forth.

In the case in which only angular (θ) motion is desired, only activation of motor 414 would be necessary. Similarly, if only radial (R) motion is desired, only motor 416 need be activated. Of course, combinations of these motions would require combinations of motor activations, which would be synchronized to achieve optimal trajectories in the position, velocity, and acceleration planes.

Figure 12:
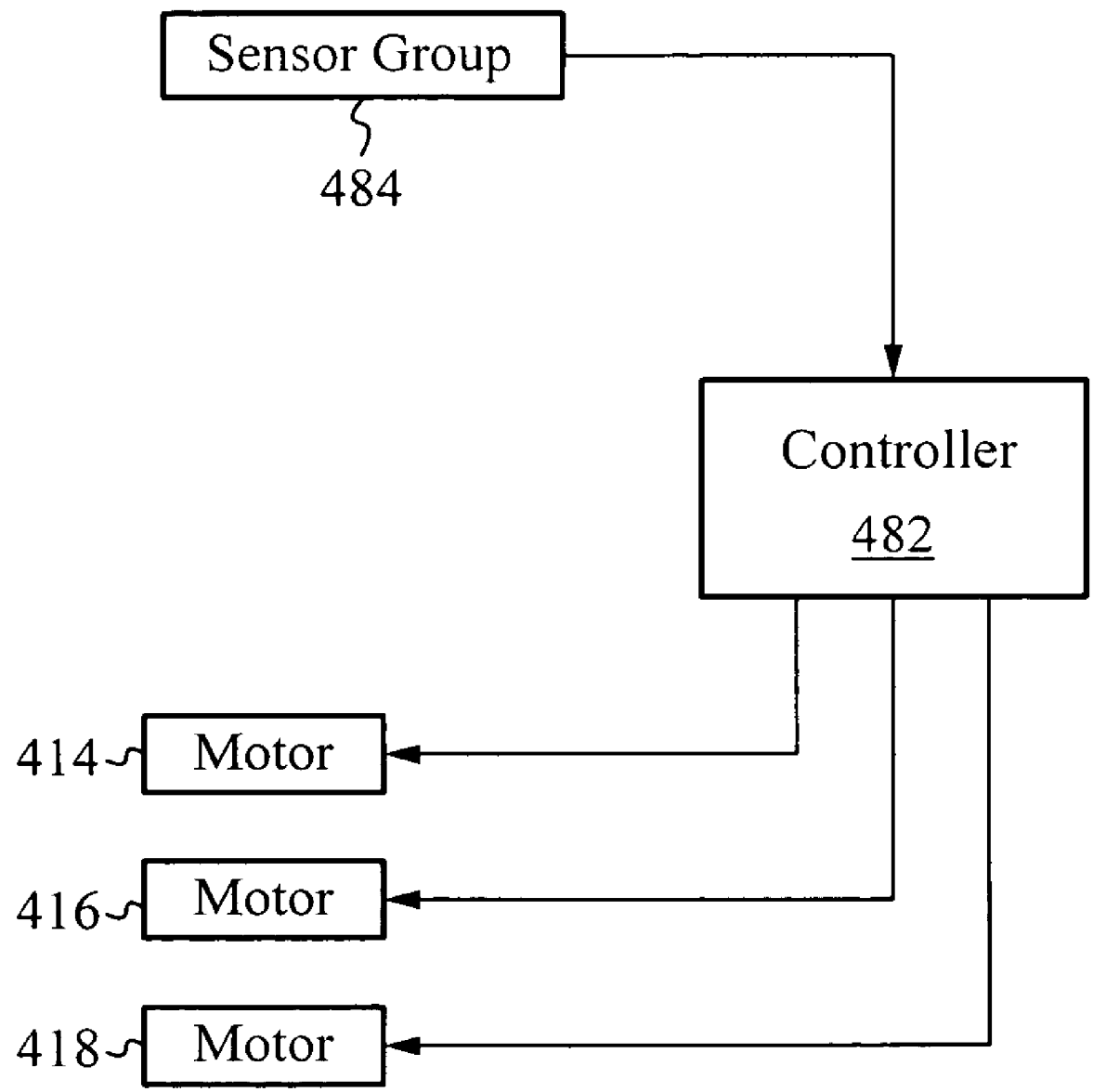
FIG. 12 is a block diagram showing the controller and related components for controlling the robot of FIG. 2.
Figure 13:
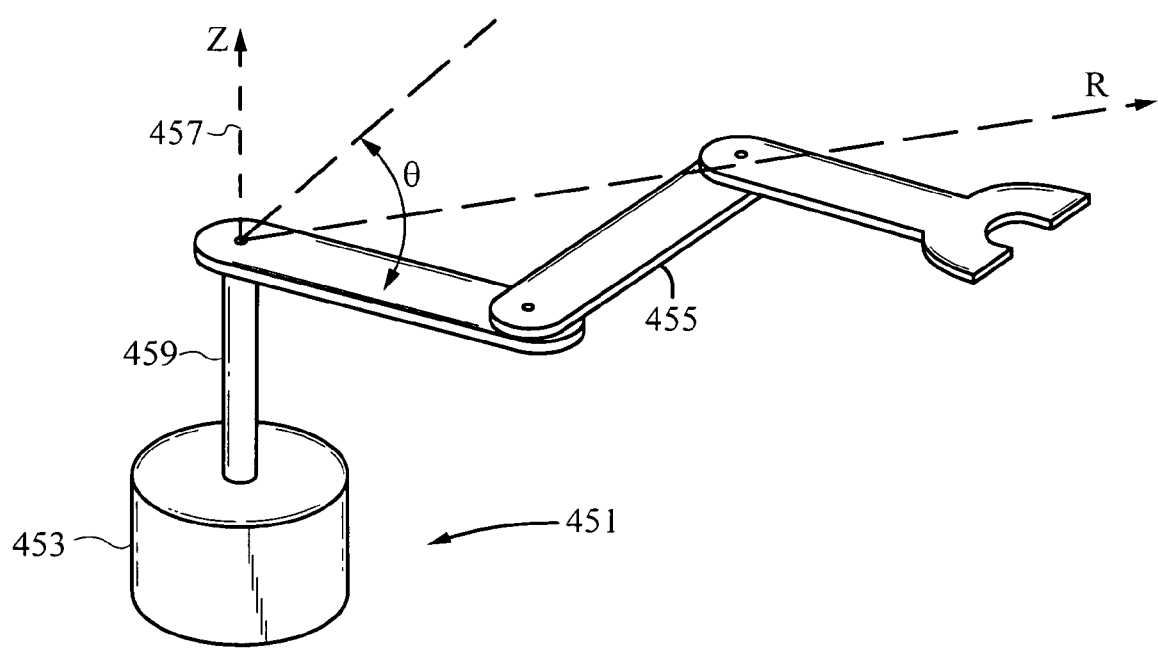
FIG. 13 is a schematic view illustrating robot motion.

It will be noted that in practice, during translation of floating Z platform 432 in the Z direction, relative motion between primary timing belt 438 and driving pulley 442 of the angular (θ) motion conversion assembly, along with relative motion between primary timing belt 462 and driving pulley 466 of the radial (R) motion conversion assembly, may in fact be desired, so that motion of the robot arm 202 can take place in multiple degrees of freedom simultaneously, in order shorten or optimize trajectories and travel times and thereby increase robot speed and performance. The relative motions can take place at different rates and in opposite directions depending on the desired trajectory, and actuation of motors 414, 416 and 418 can be controlled accordingly. Of course all motor actuation is provided by a controller which is programmable such that it causes actuation of the motors in any fashion necessary to achieve the desired trajectories, speed and acceleration profiles of robot arm 202. This is illustrated in FIG. 12, which shows that the controller 482 provides actuation signals to the motors 414, 416, and 418. The controller operates at least in part based on sensor signals from sensor group 484. The sensor signals derive from one or more sensors (not shown) which determine for example the positions of various robot components using devices such as encoders and so forth. In this manner controller 482 is provided with feedback according to which it issues the actuation signals to the motors. The controller 482 may be external to the robot 200 or internal thereto, or it may be partially external such that some components thereof are external, and partially internal such that other components thereof are internal.

Figure 18:
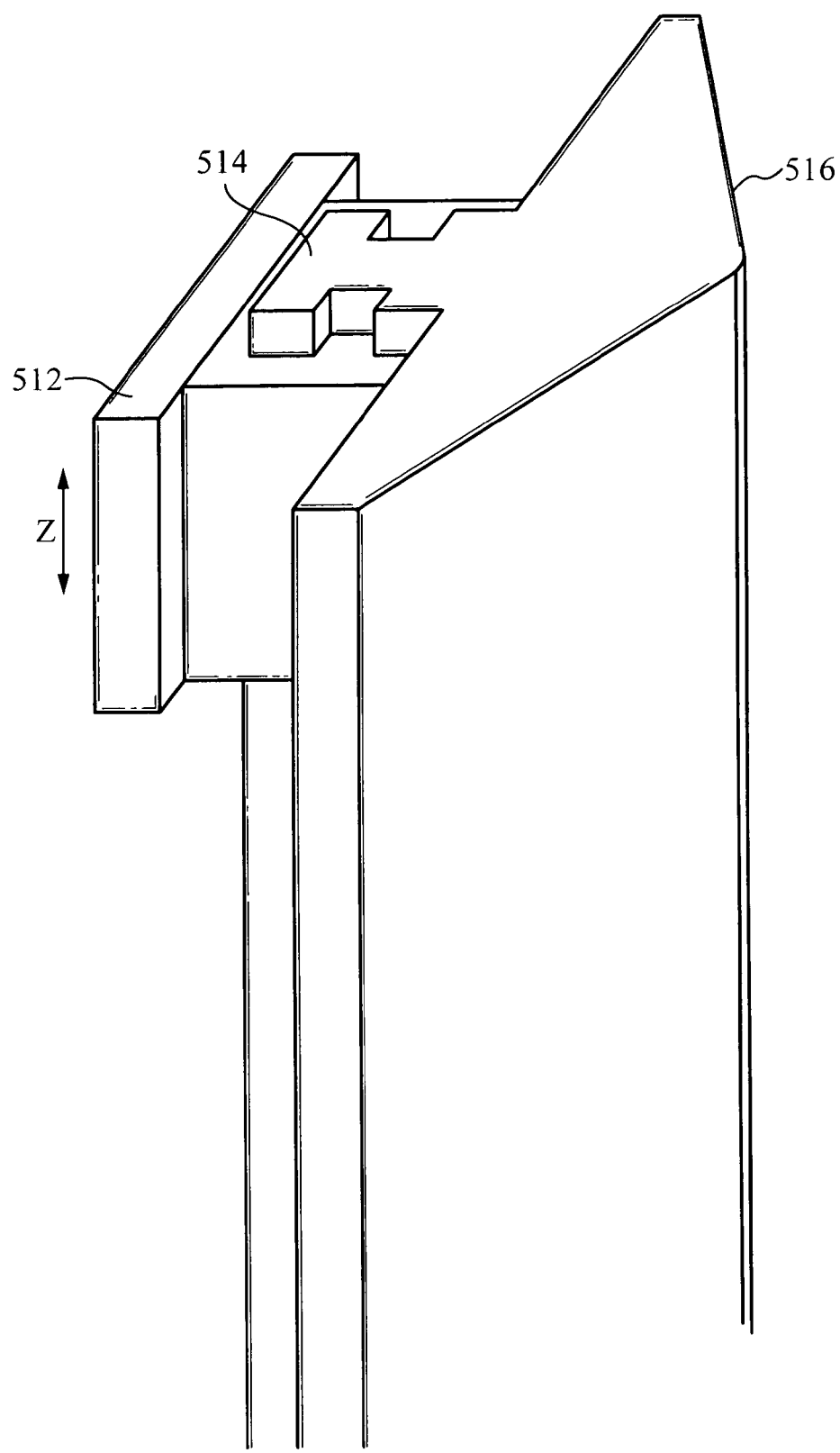
FIG. 18 is a schematic view of a slider and guide assembly.
Figure 20:
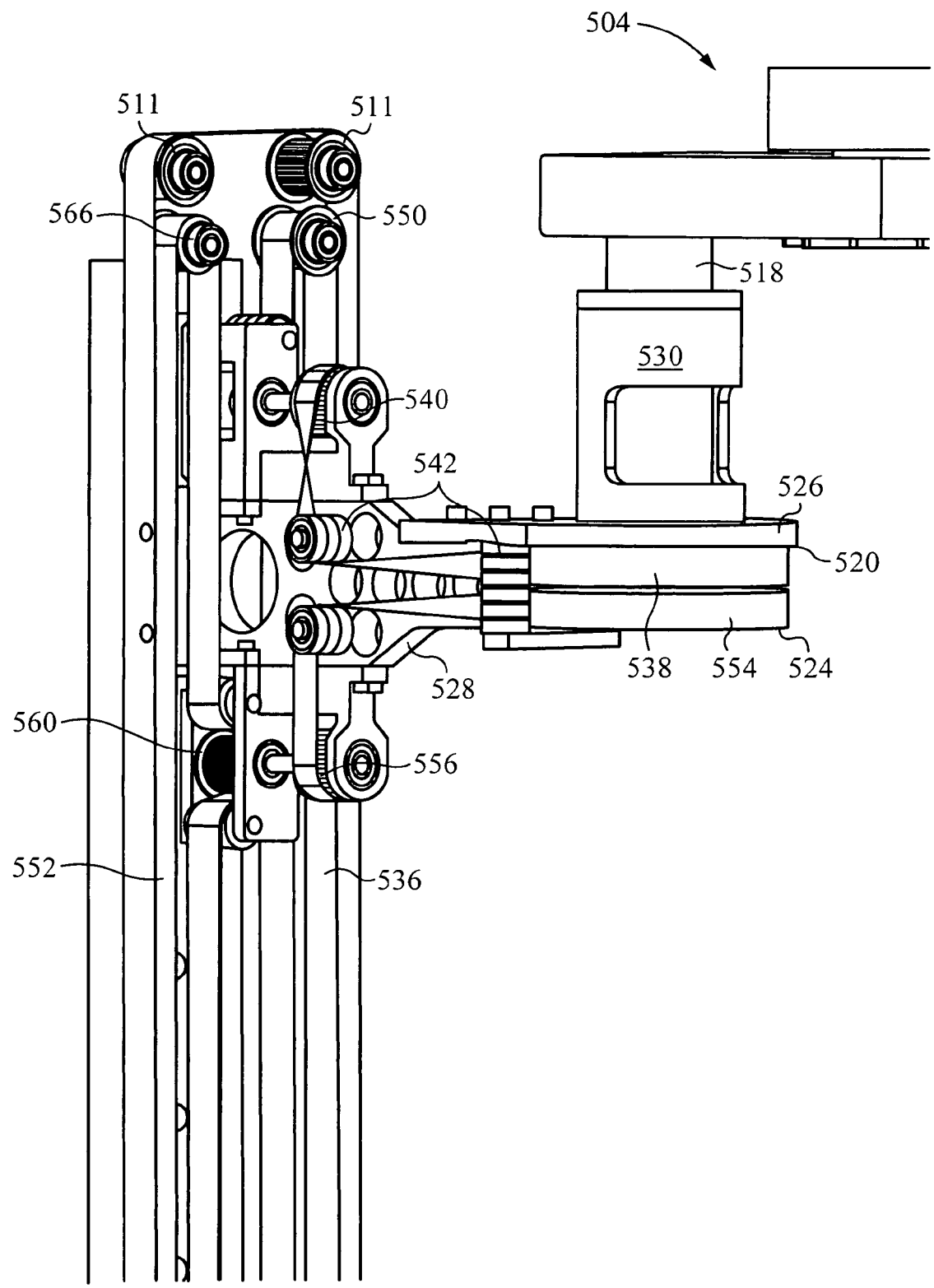
FIG. 20 is a schematic view of a side of the robot 500.
Figure 21:
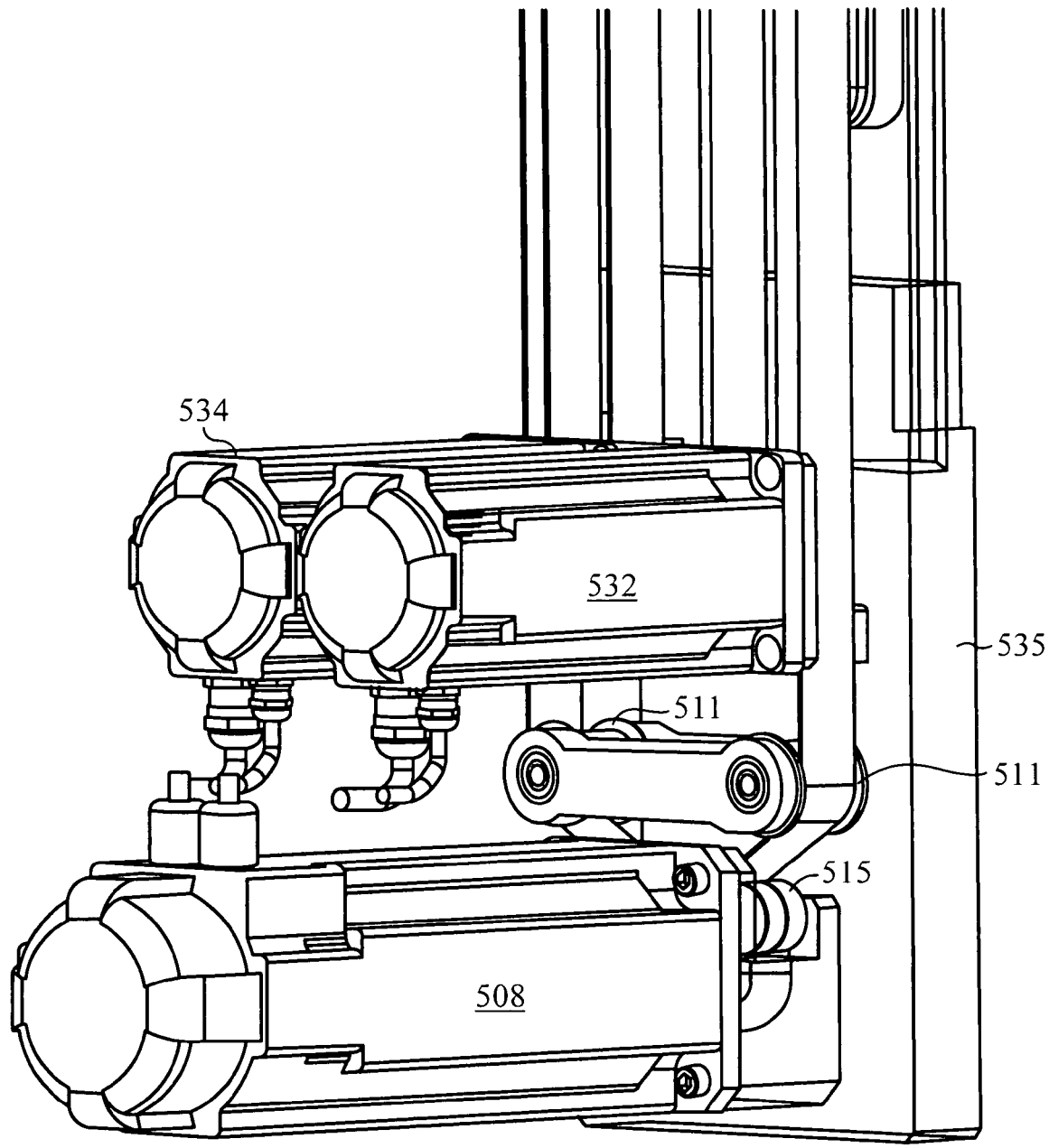
FIG. 21 is a schematic view showing robot motors.
Figure 22:
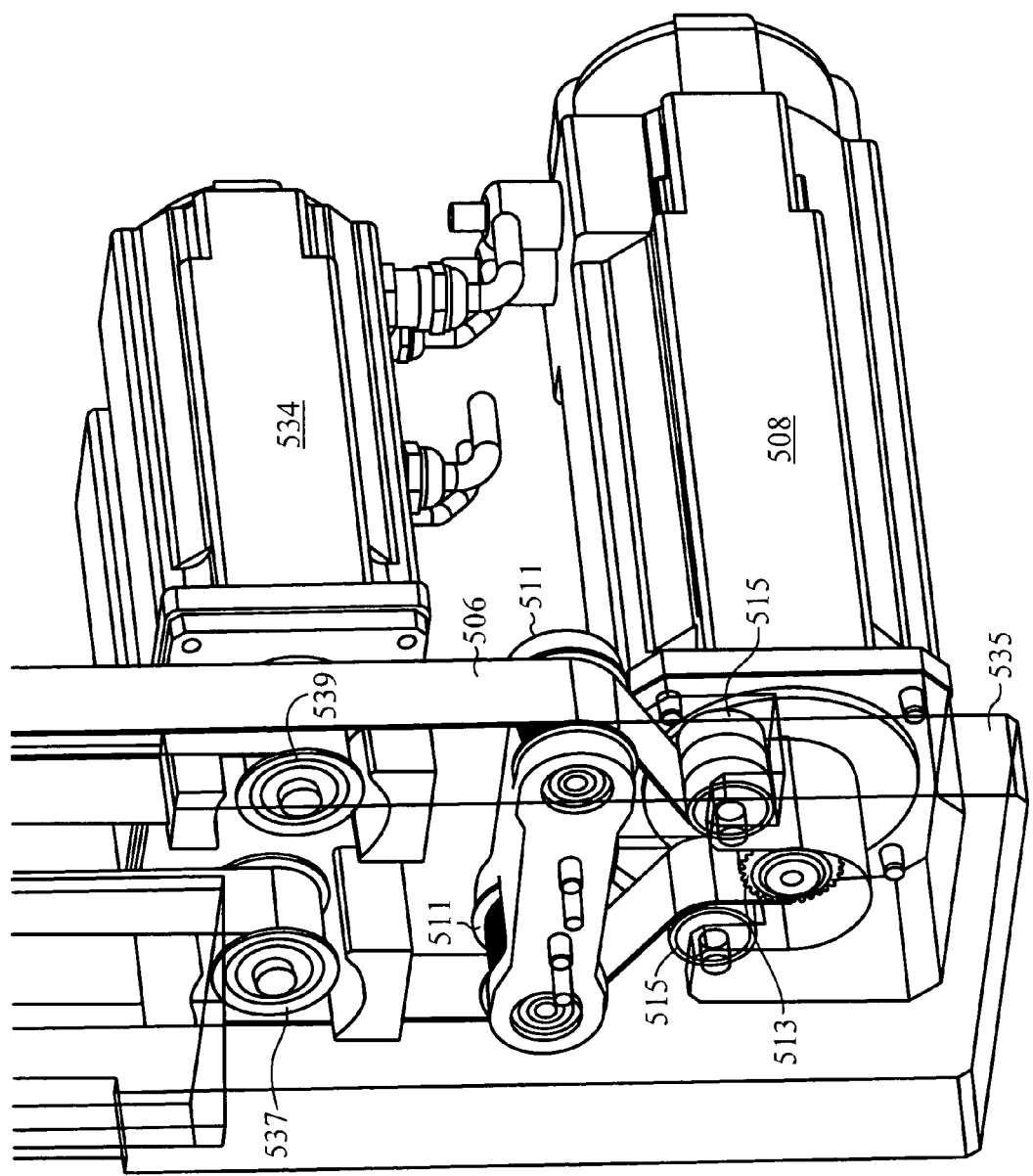
FIG. 22 is a schematic view showing robot motors and their coupling to other components.
Figure 23:
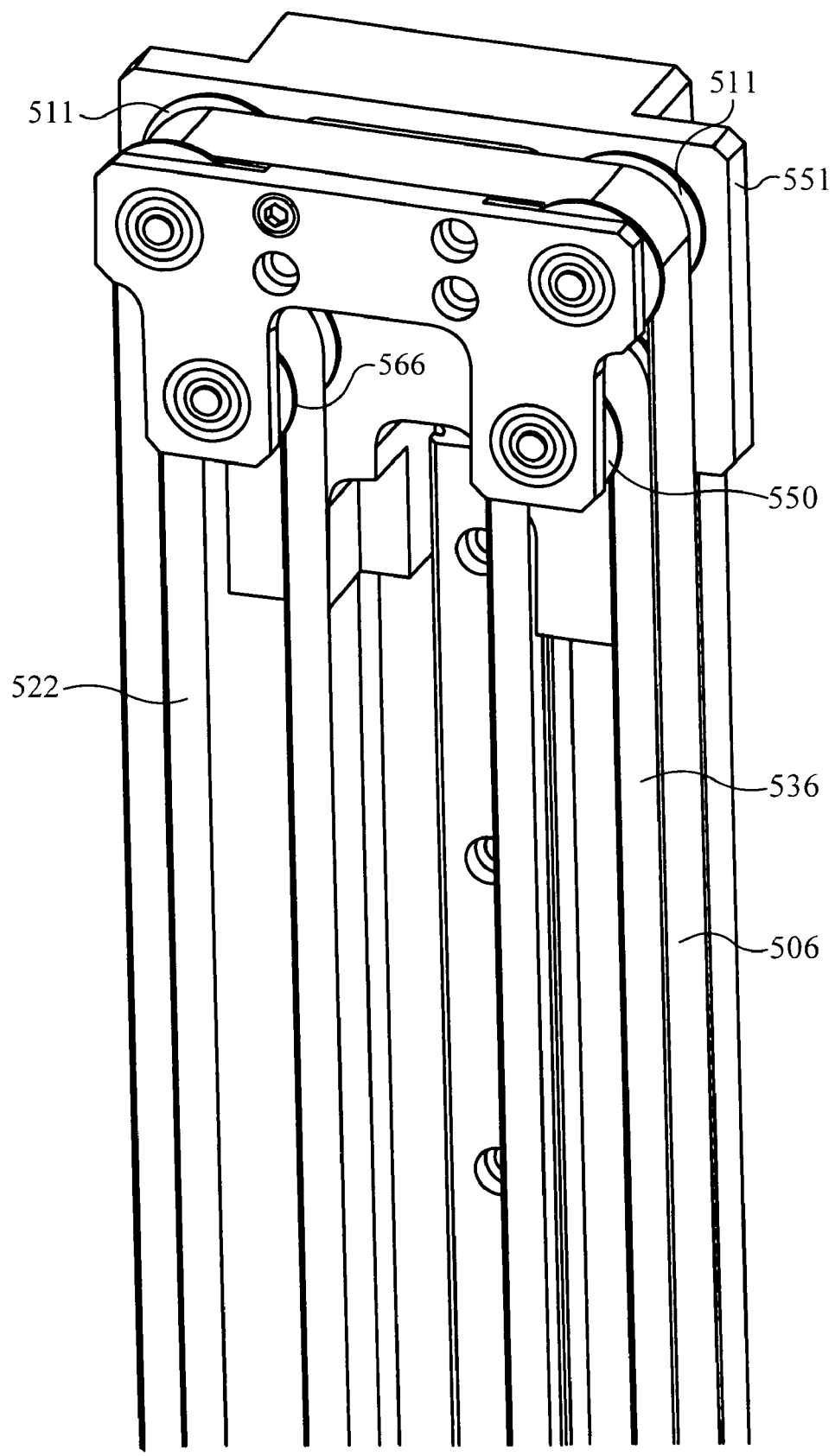
FIG. 23 is a schematic view detailing mounting of pulleys.
Figure 24:
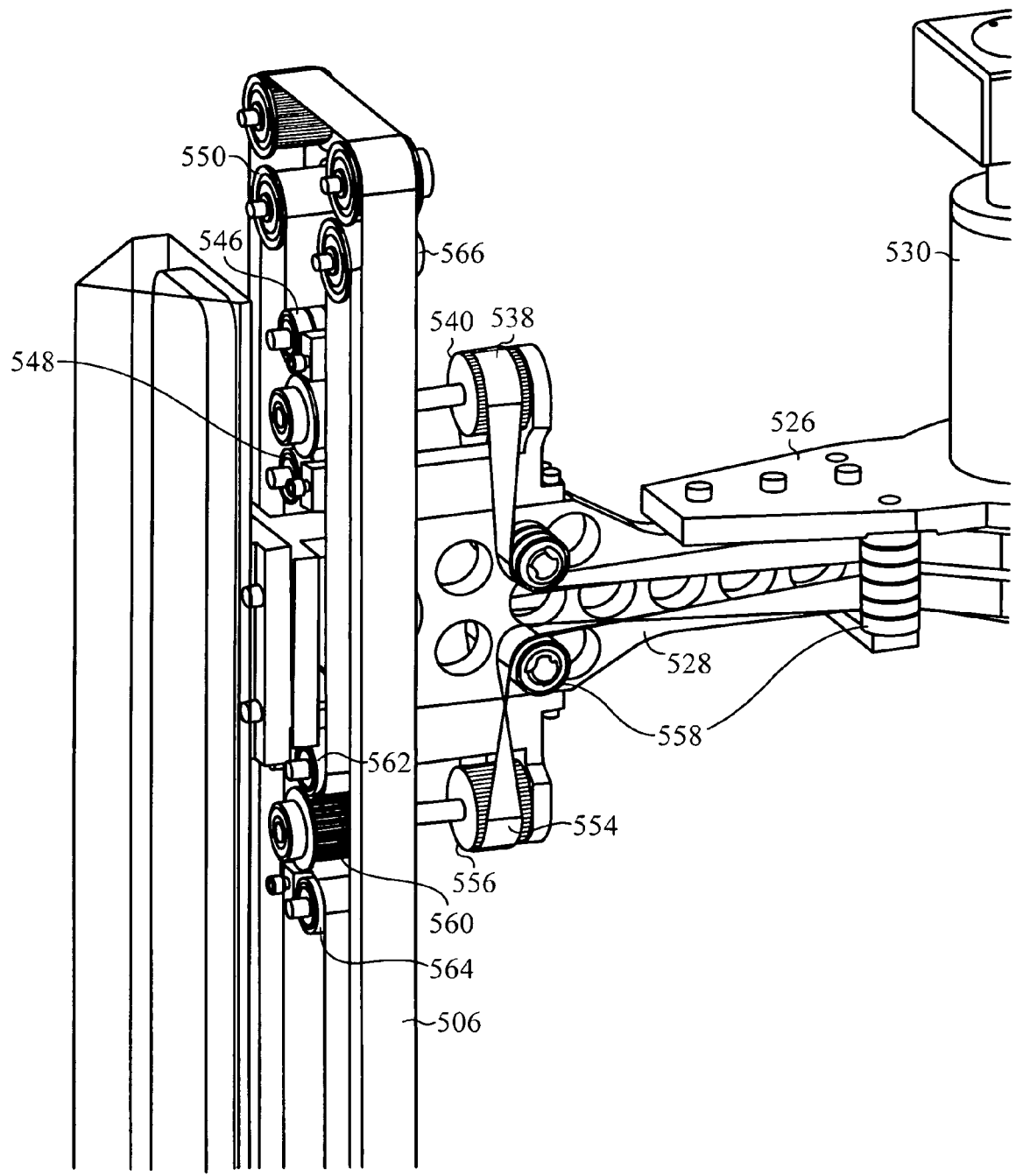
FIG. 24 is a schematic view showing a side of the robot 500.
Figure 25:
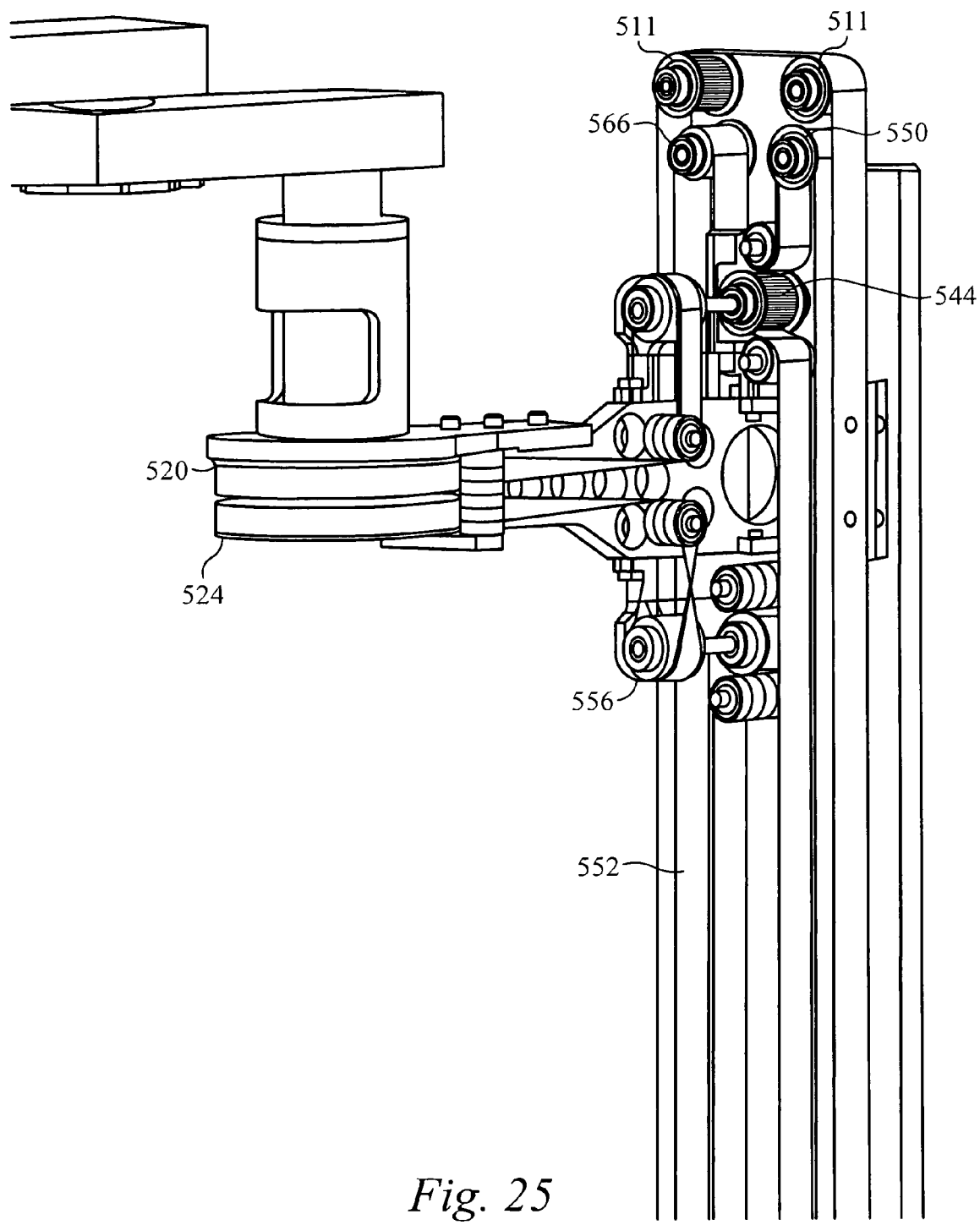
FIG. 25 is a schematic view showing a side of the robot 500.

FIGS. 16-25 are directed to a robot 500 in accordance with a second particular embodiment. The arrangement of robot 500 is particularly suited to provide extended Z motion range, and provides a more slender, compact arrangement. Robot 500 includes a floating Z platform 502 on which is mounted robot arm 504. Floating Z platform 502 is movable in the Z direction, thereby imparting such Z motion to arm 504. In particular, floating Z platform 502 is rigidly attached to a portion of timing belt 506 that moves in the Z direction. Motion of timing belt 506 is motivated by rotation of Z motion motor 508. Attachment is achieved using a clamp 510, as FIG. 17 details. Timing belt 506 is tensioned around a plurality of toothed pulleys 511 (FIG. 20), and engages a toothed pulley 513 driven by the drive shaft of motor 508 (FIG. 22). Good engagement is maintained using pins or freely rotation wheels 515 positioned on opposite sides of the pulley 513, between which timing belt 506 is passed. Floating Z platform is constrained to Z motion by being rigidly mounted to slider 512, which, as detailed in FIG. 18, is constrained to move in the Z direction by guide 514 disposed in support structure 516. It will be appreciated that other arrangement in view of timing belt 506 can be used to motivate the floating form. These include a ball screw type mechanism as discussed above with respect to FIG. 10, or a rack and pinion type mechanism as discussed above with reference to FIG. 11.

Figure 19:
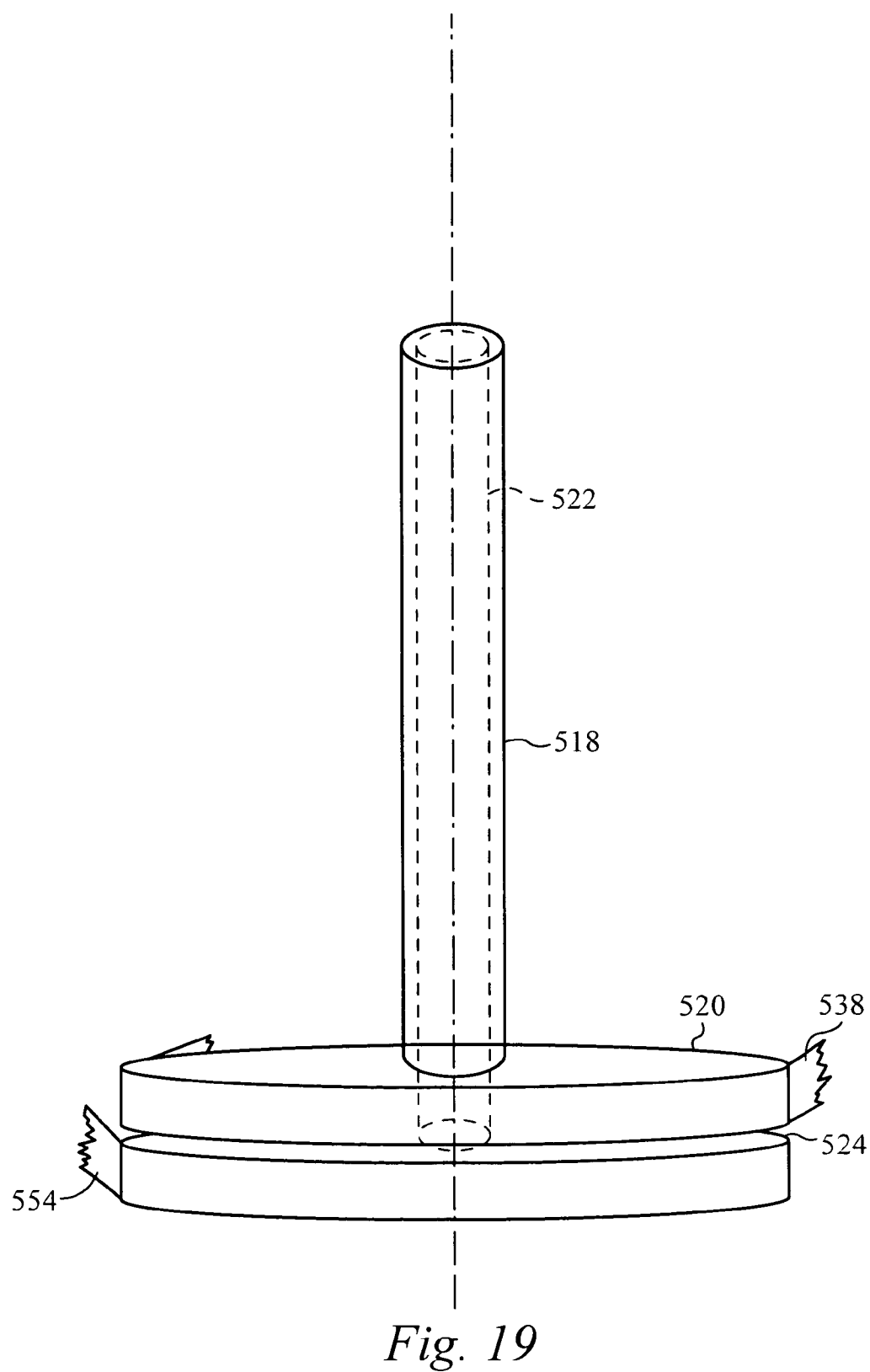
FIG. 19 is a schematic view showing the shaft and large pulley connections.

As with the previous embodiment, angular (θ) and radial (R) motions are imparted to arm 504 using nested shafts having a common shaft axis about which they are independently rotatable. With reference to FIGS. 19 and 20, the shafts include outer angular (θ) motion shaft 518 rigidly connected to large, toothed pulley 520, and inner, (R) motion shaft 522 rigidly connected to large, toothed pulley 524. The pulleys and shafts are rotatably mounted in floating Z platform 502 and movable in the Z direction therewith, imparting commensurate movement to robot arm 504. Pulley 520 is stacked above pulley 524, although the reverse is possible. In either case, the rotation of each of the pulleys and of the shaft connected thereto, is independent of the rotation of the other of the pulleys and of the shaft connected thereto. Rotation of outer shaft 518 imparts angular (θ) motion to robot arm 504 and rotation of inner shaft 522 imparts radial (R) motion to robot arm 503, in the manner detailed above. A top flange 526 mounted on cantilevered member 528 retains the pulleys 520 and 524 in place and supports a column 530 which in turn rotatably supports shafts 518 and 522 therein. It is cantilevered member 528 that is anchored, at one end, to slider 512 such that the cantilever, and the floating Z platform 502, can move in the Z direction.

Rotation of large, toothed pulleys 520 and 524 is motivated respectively by θ-axis motor 532 and R-axis motor 534, which, along with motor 508, are mounted on motor bracket 535 attached to support 516 (FIG. 21). For the angular (θ) motion, rotation of motor 532 is transferred to pulley 520 by way of primary timing belt 536 and secondary timing belt 538. Motor 532 is provided with a drive pulley 537 (FIG. 22) having teeth which engage complementary teeth (not shown) of primary timing belt 536 such that the rotation of motor 532 motivates motion of the primary timing belt. Secondary timing belt 538 is part of an angular (θ) motion conversion assembly that includes driven toothed pulley 540, along with freely rotating pins or wheels 542 around which the secondary timing belt is directed to achieve desired tension and directional changes. Driven toothed pulley 540 is coaxially and rigidly coupled to drive toothed pulley 544 for rotation therewith. Drive toothed pulley 544 is engaged by the teeth of the confronting surface of primary timing belt 536 such that motion of the primary timing belt imparts motion to the drive toothed pulley. To bias drive pulley 544 against primary timing belt 536 to achieve proper engagement therewith, guiding wheels 546 and 548 are provided on opposite sides of the drive pulley. Proper tension in primary timing belt 536 is maintained using a toothed idler pulley 550 rotatably mounted for free rotation in bracket 551 (FIG. 23), which is grounded to support structure 516. Tension can be adjusted in the manner discussed above.

For radial (R) motion, rotation of motor 534 is transferred to large, toothed pulley 524 by way of primary timing belt 552 and secondary timing belt 554. Motor 534 is provided with a drive pulley 539 (FIG. 22) having teeth which engage complementary teeth (not shown) of primary timing belt 552 such that the rotation of motor 534 motivates motion of the primary timing belt. Secondary timing belt 554 is part of a radial (R) motion conversion assembly that includes driven toothed pulley 556, along with freely rotating pins or wheels 558 around which the secondary timing belt is directed to achieve desired tension and directional changes. Driven toothed pulley 556 is coaxially and rigidly coupled to drive toothed pulley 560 for rotation therewith. Drive toothed pulley 560 is engaged by the teeth provided on the confronting surface of primary timing belt 552 such that motion of the primary timing belt imparts motion to the drive toothed pulley. To bias drive pulley 560 against primary timing belt 552 to achieve proper engagement therewith, guiding wheels 562 and 564 are provided on opposite sides of the drive pulley. Proper tension in primary timing belt 536 is maintained using a toothed idler pulley 566 rotatably mounted for free rotation in bracket 551 (FIG. 23), which is grounded to support structure 516. Tension can be adjusted in the manner discussed above.

Again it will be appreciated that optimal operation of robot 500 may synchronization in the angular (θ), radial (R) and Z axes in the position, velocity and acceleration planes. Considering again the simple case in which it is desired to maintain the angular (θ) and radial (R) positions of the robot arm 504 while changing its Z position, it will be necessary to actuate z-axis motor 508 to the extent that the desired Z position change. Simultaneously, motors 532 and 534 can be actuated so as to avoid relative motion between primary timing belt 536 and its associated angular (θ) motion conversion assembly on the one hand, and also to avoid relative motion between primary timing belt 552 and its associated radial (R) motion conversion assembly. Therefore in this case, Z motion is achieved by activating all three motors 508, 532 and 534. When only angular (θ) or only radial (R) motion is desired, then, respectively, only motor 532 or motor 534 need be activated. When combinations of these motions is desired, then suitable motor synchronization schemes can be applied by a robot controller to achieve optimal motion profiles in not only the position planes, but in the velocity and acceleration planes as well.

Figure 14:
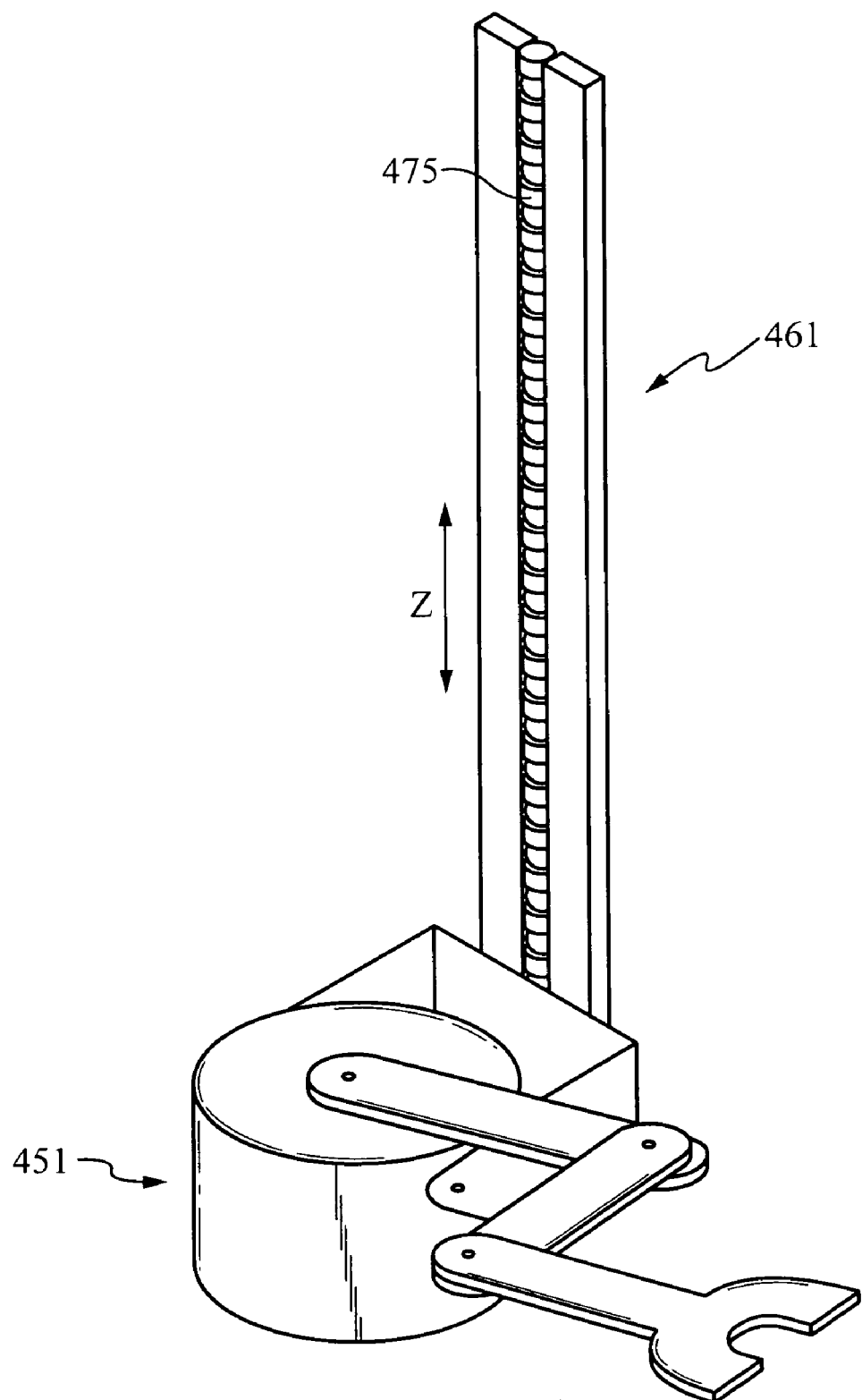
FIG. 14 illustrates a contraption by which robot Z motion can be extended.
Figure 15:
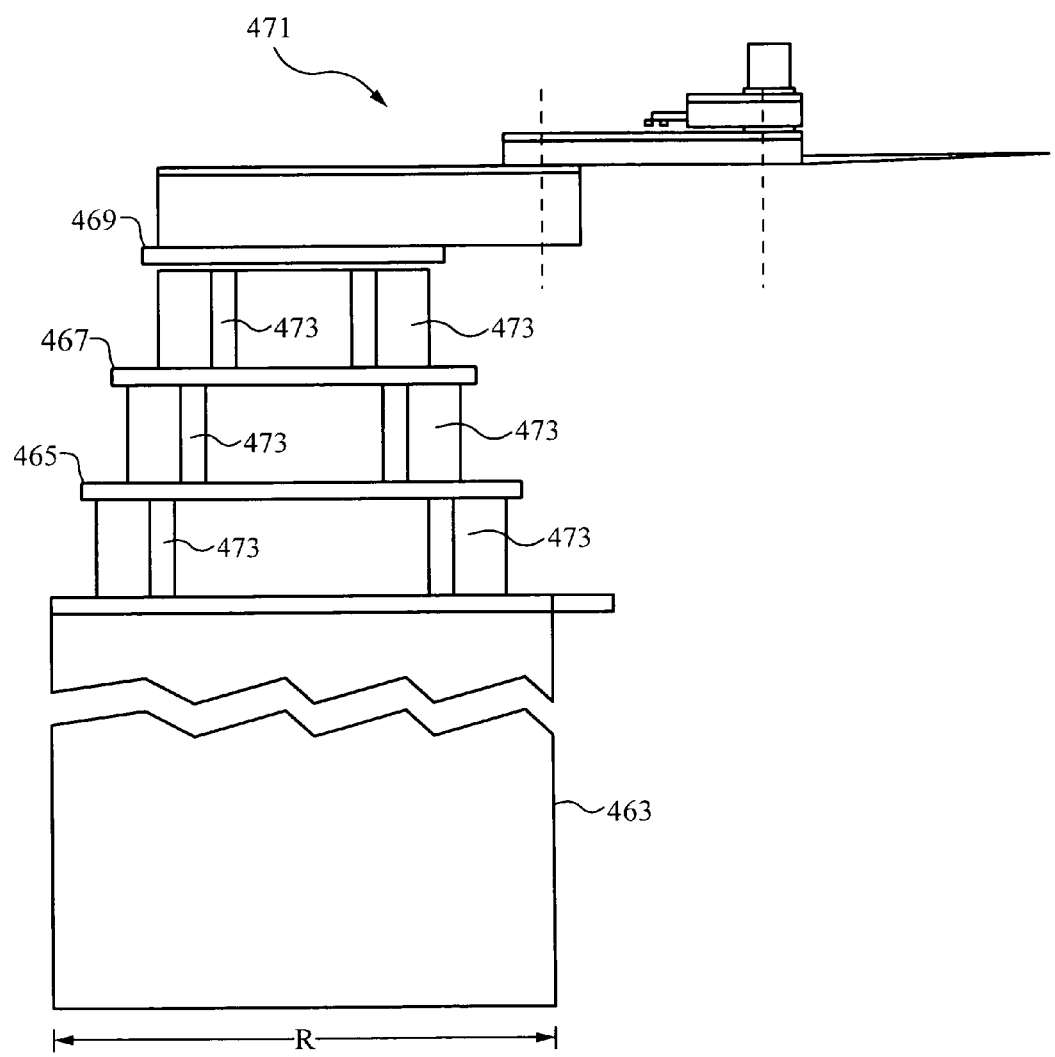
FIG. 15 illustrates another approach to extending robot Z motion.
Figure 16:
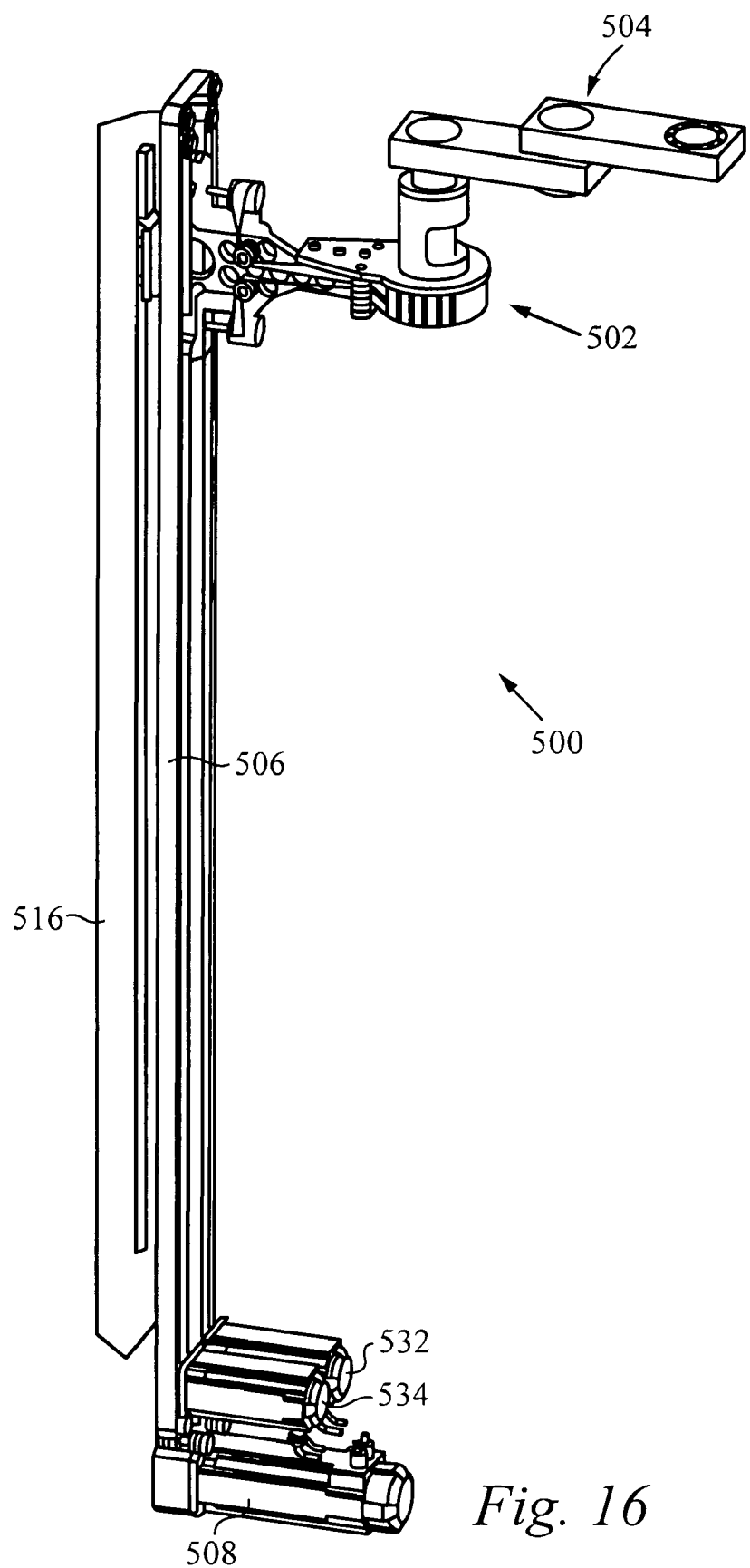
FIG. 16 illustrates a particular embodiment of the invention.
Figure 17:
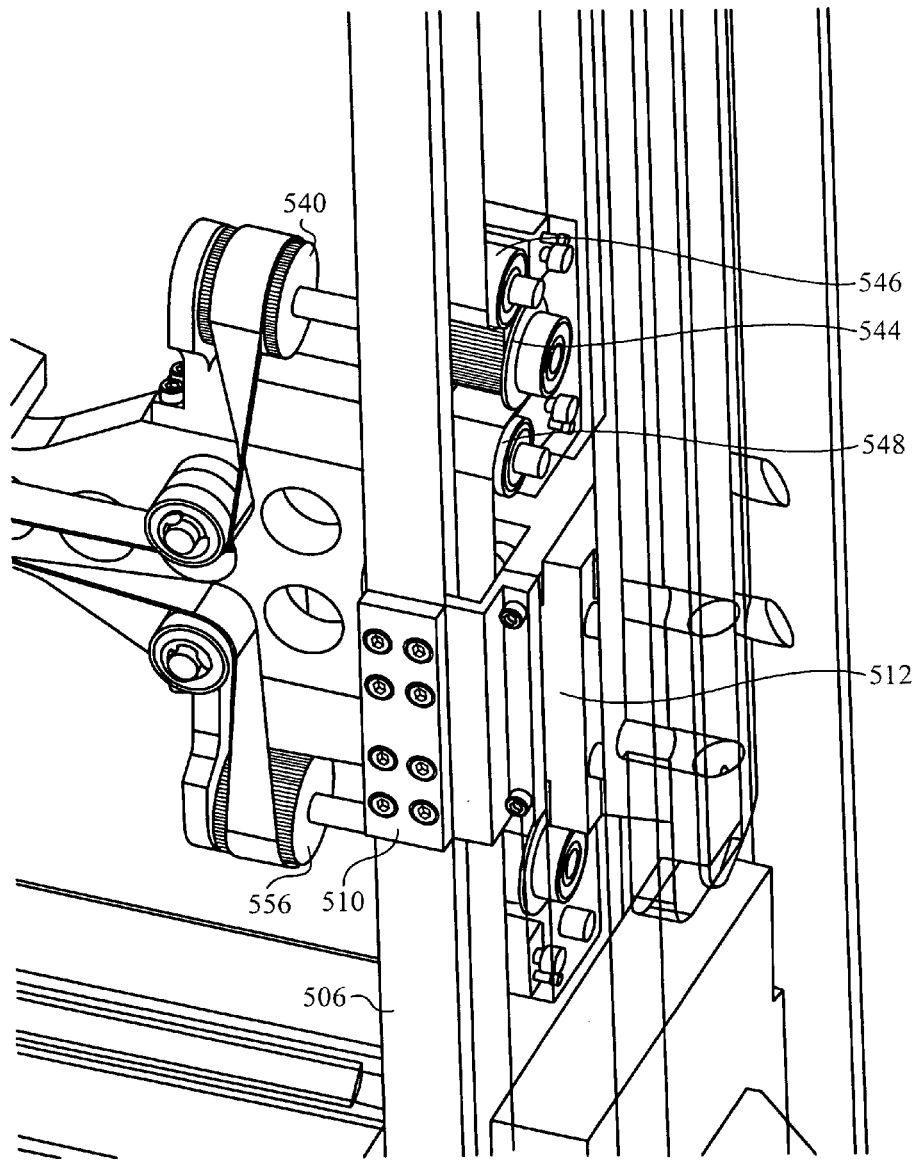
FIG. 17 is a schematic view detailing a clamp attaching the floating platform to the timing belt.
Figure 26:
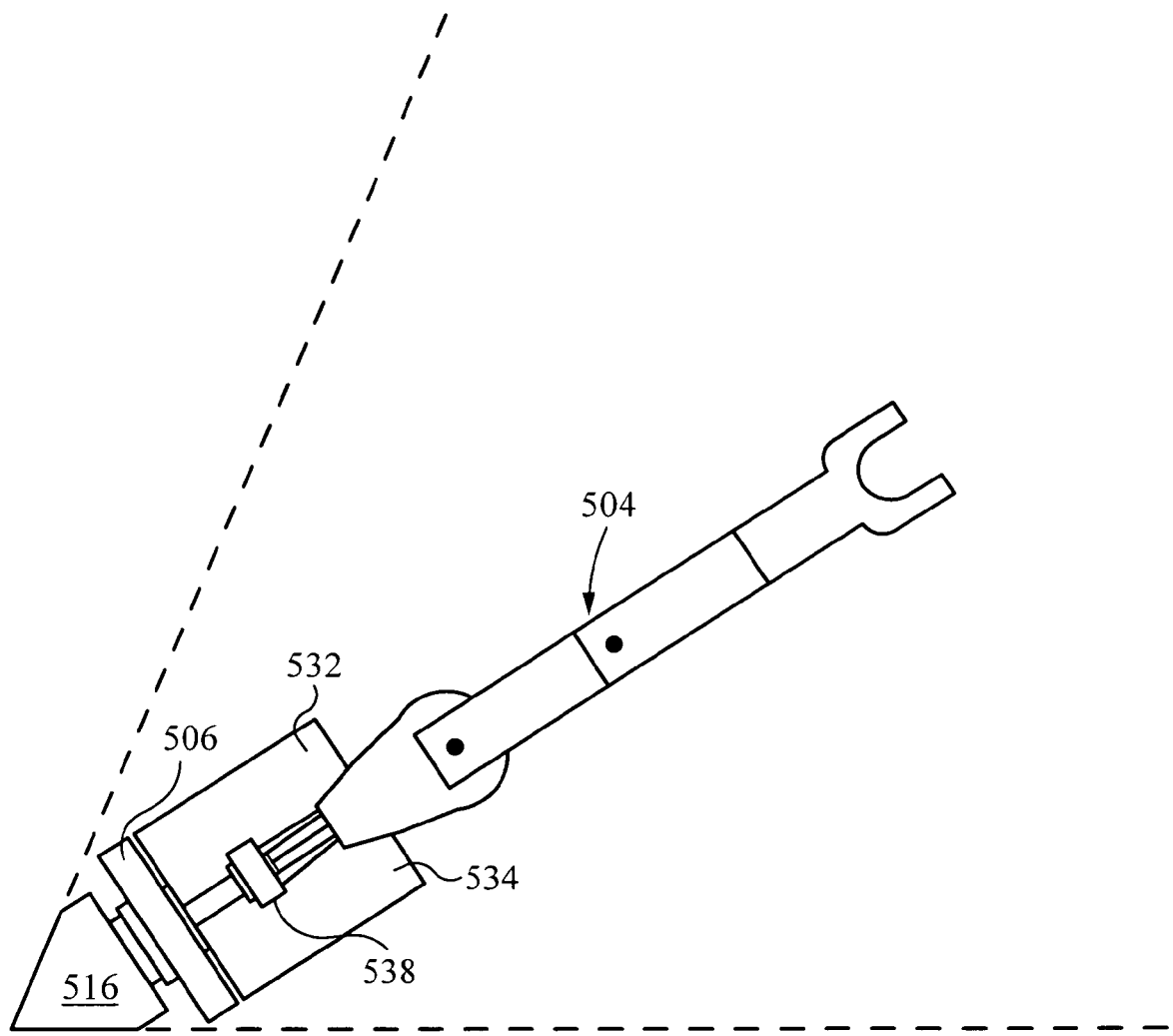
FIG. 26 is a schematic top view of robot 500.

As mentioned above, the arrangement of robot 500 is particularly suited to provide extended Z motion range, and enables a more slender, compact arrangement. Most conspicuously, the arrangement of the second particular embodiment does away with the supports 408 and 410 and top plate 402. This is facilitated by moving the primary timing belts, including timing belt 506, closer to support structure 516, and by reducing the size and profile of the floating Z platform, such that moments attributable to these components are reduced and tension and forces generated by them are directed more toward the support structure. The size and footprint of the floating Z platform are further streamlined by configuring the cantilevered member 528 in a substantially vertical plane such that the drive toothed pulleys 544 and 560 mounted to top and bottom edges of the cantilevered member are stacked one over the other, as are the driven toothed pulleys 540 and 556. The resultant narrow profile enables placement of primary timing belts 536 and 552 on opposite sides of the cantilevered member 528 in close proximity to one another for engagement with the drive toothed pulleys, and enables disposing timing belt 506 circumferentially around the combination, for further compactness. From a top view perspective shown in FIG. 26, it will be appreciated that robot 500 is generally narrower and thus operates with smaller "dead-zones." It can therefore be disposed in a work environment in which more stations can be placed around it, particularly when compared to the arrangement of FIG. 14, which, due to the girth of the robot 451 and the translation module 471, occupies a much larger arc and has therefore has a greater dead zone.

The above are exemplary modes of carrying out the invention and are not intended to be limiting. It will be apparent to those of ordinary skill in the art that modifications thereto can be made without departure from the spirit and scope of the invention as set forth in the following claims.

The invention claimed is:

1. A robot comprising:
a robot arm including first and second links;
a support structure including a guide;
a platform mounted for motion relative to the support structure, the platform coupled to the guide of the support structure such that motion of the platform is directed by the guide along a first direction;
first and second primary timing belts having portions that extend substantially along the first direction;
first and second shafts supported by the movable platform for motion therewith in the first direction and having a common shaft axis, extending in the first direction, about which the first and second shafts are independently rotatable, the first and second shafts being coupled to the first and second primary timing belts, respectively, such that motion of the first primary timing belt in the first direction imparts rotation of the first shaft and motion of the second primary timing belt in the first direction imparts rotation of the second shaft, the first and second shafts further being coupled to the robot arm such that rotation of the first shaft imparts motion to the first link of the robot arm and rotation of the second shaft imparts motion to the second link of the robot arm;
a third timing belt including a portion configured to extend in the first direction, said platform being coupled to said portion such that movement of said portion along the first direction imparts movement to the platform in the first direction; and
first, second and third motors configured such that actuation of the first, second and third motors imparts motion to the first, second and third timing belts, respectively.

2. The robot assembly of claim 1, wherein the third timing belt is mounted circumferentially around the first and second timing belts.

* * * * *